(12) United States Patent
Chung

(10) Patent No.: US 8,578,226 B2
(45) Date of Patent: Nov. 5, 2013

(54) APPARATUS AND SYSTEM FOR IMPLEMENTING VARIABLE SPEED SCAN TESTING

(75) Inventor: Sung Soo Chung, San Jose, CA (US)

(73) Assignee: Eigenix, San Jose, CA (US)

( * ) Notice: Subject to any disclaimer, the term of this patent is extended or adjusted under 35 U.S.C. 154(b) by 411 days.

(21) Appl. No.: 12/806,594

(22) Filed: Aug. 17, 2010

(65) Prior Publication Data

US 2012/0047412 A1 Feb. 23, 2012

(51) Int. Cl.
*G01R 31/28* (2006.01)

(52) U.S. Cl.
USPC .......................................................... 714/731

(58) Field of Classification Search
None
See application file for complete search history.

(56) References Cited

U.S. PATENT DOCUMENTS

| 7,209,852 | B2 * | 4/2007 | Bleakley | 702/125 |
|---|---|---|---|---|
| 7,461,310 | B2 * | 12/2008 | Wang | 714/729 |
| 7,500,165 | B2 * | 3/2009 | Guettaf | 714/731 |
| 7,934,136 | B2 * | 4/2011 | Harada | 714/738 |
| 7,996,743 | B1 * | 8/2011 | Tan et al. | 714/745 |
| 8,010,856 | B2 * | 8/2011 | Cannon et al. | 714/726 |
| 8,327,205 | B2 * | 12/2012 | Waayers et al. | 714/731 |
| 2006/0069973 | A1 * | 3/2006 | Athavale et al. | 714/726 |
| 2008/0163020 | A1 * | 7/2008 | Cooke et al. | 714/731 |
| 2008/0282110 | A1 * | 11/2008 | Guettaf | 714/30 |
| 2009/0113263 | A1 * | 4/2009 | Cannon et al. | 714/726 |
| 2009/0254787 | A1 * | 10/2009 | Ramachandran | 714/731 |
| 2010/0162060 | A1 * | 6/2010 | Chakravarty et al. | 714/731 |

* cited by examiner

*Primary Examiner* — Gabriel Chu
(74) *Attorney, Agent, or Firm* — Guadalupe M. García

(57) ABSTRACT

In an embodiment of the invention, variable test clock circuitry is provided within an integrated circuit desired to be tested. The variable test clock frequency implements a test clock control register that receives serial test data from a device tester and is configured to serially pass the received test data to scan test chains within the integrated circuit. The test clock control register stores test clock information. The test clock information is provided to a test clock generator where the test clock generator then produces test clock signals at a predetermined frequency. The test clock signal is then provided as a test clock frequency for the scan test chains within the integrated circuit. Methods are also disclosed for operating the variable test clock frequency.

10 Claims, 23 Drawing Sheets

Expected Output Pattern
Output of Scan Chain 7,
Vector # 2

1302

Input Test Pattern
Input of Scan Chain 7,
Vector # 2

| Input Test Vector (1602) | Expected Output Vector (1604) |
|---|---|
| 1 0 1 0 1 1 1 0 1 0 1 (1606) | X X L H H X X X X X X (1608) |
| 1 1 0 1 1 0 1 0 1 1 1 (1610) | H L H H X X X X X X X (1612) |
| 0 1 1 1 0 1 0 1 0 0 0 (1614) | X X X X X H H X X X X (1616) |

Figure 16

APPARATUS AND SYSTEM FOR IMPLEMENTING VARIABLE SPEED SCAN TESTING

FIELD OF THE INVENTION

The present invention generally relates to the field of testing integrated circuits. More particularly, the present invention relates to an apparatus and method for performing scan testing that implements a variable test clock frequency.

BACKGROUND OF THE INVENTION

As integrated circuits (ICs) have continued to become faster, smaller, and more complex, the ability to test them has become more difficult but, at the same time, such testing has become more critical. Integrated circuit designers and manufacturers have come to realize that in order to assure the integrity of their products, high-quality, and cost effective testing must be implemented.

In the past, "bed-of-nails" testers were appropriate where the board-under-test was available to be lowered onto a set of test points (nails) that probe points of interest on the board. These could be sensed (observed) and driven (controlled) to test the complete board. The increasing complexity of boards and the movement to technologies such as nanometer designs, multi-chip modules (MCMs), and surface mount technologies (SMTs) made the bed-of-nails approach ineffective as fewer and fewer nodes on a chip could be externally accessed.

Nevertheless, the concepts of observability and controllability continue to be fundamental in being able to properly test a circuit. In an optimum situation, a circuit can be fully observed and fully controlled. In actual application, both observability and controllability are often limited, sometimes severely, especially in highly integrated circuits.

Scan techniques offer the ability to better observe and control these more complex chips. For example, boundary scan techniques offer the ability to test boundary circuitry of an IC, e.g., circuitry within the IC that directly interfaces with a printed circuit board. Also, internal scan techniques are used to test the circuitry that can be deep within the IC. Each of these techniques will be briefly described to provide context to the present invention.

As is the case in many situations, the adoption of a standard facilitated an industry implementation. In the case of boundary scan, system designers agreed on a unified scan-based methodology that are set forth in IEEE STD 1149.1, 0.4, and 0.6, which are incorporated herein for all purposes. Boundary scan was originally developed by the Joint Test Access Group and is often called JTAG.

The basic architecture of IEEE STD 1149.1 boundary scan is incorporated at the integrated circuit level as shown in FIG. 1. The I/O pins 102 of each IC on the board are connected serially in a standardized scan chain 104 accessed through the Test Access Port (TAP) 106 so that every pin 102 can be observed and controlled remotely through scan chain 104. At the board level, IC 108 can be connected in series with other ICs to form a scan chain 104 spanning the entire board containing multiple ICs. Connections to IC 108 are tested by scanning values into the outputs of each IC 108 and checking that those values are received at the inputs of the IC 108. IC 108 with internal scan chain 104 and BISTs can access those features through the boundary scan technique to provide a unified testing framework.

A key feature of the IEEE STD 1149 boundary scan technique is the implementation of a Test Access Port (TAP) 106. TAP 106 includes four, or optionally five or more, single bit connections. These connections interface with certain on-chip boundary scan logic to implement a communication protocol. The communication protocol used for boundary scan is driven by TCK 120 and TMS 122 and, optionally, TRST 130. TCK 120 is a Test Clock input that is used to, among other things, shift data into and out of ICs 108. TMS 122 is a Test Mode Select input that controls the types of test operations to be conducted. TDI 124 is a Test Data In that inputs the test data and instructions to be used by the IC 108 during testing. TDO 126 is a Test Data Out output that includes the results of the testing. This output is driven only when TAP controller 128 is in the shift TAP controller state, Shift-DR or Shift-IR. Optional TRST 130 is a Test Reset Signal input that is an active low signal that asynchronously resets the TAP controller 108 if no power-up reset signal is automatically generated by IC 108.

When the IC 108 is in a normal mode, TRST 130 and TCK 120 are held low and TMS 122 is held high in order to disable boundary scan. To prevent race conditions, inputs are sampled on the rising edge of TCK 120 and outputs toggle on the falling edge.

TAP controller 128 is typically a 16-state FSM that proceeds from state to state based on TCK 120 and TMS 122 signals. It provides signals that control a test data register and an instruction register. These include serial shift clocks and update clocks.

A state transition diagram 200 for the TAP controller 129 is shown in FIG. 2. The TAP controller 128 is initialized to Test-Logic-Reset 202 on power-up by TRST or by an internal power-up detection circuit. TAP controller 128 moves from one state to the next on the rising edge of TCK 120 based on the value of TMS 122. A typical test sequence will involve clocking TCK 120 and setting TRST 130 to 0 for a few cycles and then returning this signal to 1 to reset the TAP controller 108. TMS 130 is then toggled to traverse the state machine for whatever operation is required.

The transition diagram 200, as shown in FIG. 2, provides the roadmap for IEEE STD 1149.1 applications. Each state contains a label with a designated path that depends on the state of TMS 130 at the rising edge of TCK 120. The two vertical columns 204 and 206 each containing seven states that are substantially similar. Column 204 is the data column that makes use of a data register and column 206 is the instruction column that makes use of an instruction register. By traversing the states of column 204, data can be manipulated in IEEE STD 1149.1 testing, and by traversing the states of column 206, instructions can be called out for execution. Operations can include, for example, serially loading an instruction register or serially loading or reading data registers that are used to test interconnections between chips on a board.

More generally, scan techniques can be implemented to test almost any internal circuitry within an IC. To do this, storage elements within an IC are replaced with scan cells. For example, as shown in FIG. 3, where an IC may have multiple storage elements such as D flip-flop storage element 302, such storage elements can be replaced with scan cells 350.

Storage element 302 is shown with inputs D 304, Q 306, and CK 308. In a typical application, the signal at D 304 is output to Q 306 upon the rising edge of clock signal CK 308. Storage elements 302-1, 302-2, and 302-3 can be found throughout an integrated circuit as shown in FIG. 3 to facilitate the operation of combinational logic 310.

Scan cell 350 is more complex than storage element 302 with the addition of multiplexer 352 but operates similarly to storage element 302 during normal operation. In normal operation of scan cell 350 when scan enable SE 354 is set low, the signal at DI 356 is directed to input D 358 and output to Q/SO 360 upon the rising edge of clock signal CK 362. In this way, the implementation of scan cells 350-1, 350-2, and 350-3 with scan enable SE 372 set low allows for the operation of combinational logic 366 to be substantially similar to the operation of combinational logic 310.

Scan cell 350, however, allows for the scanning in and scanning out of data. For example, during a scan-in operation when scan enable SE 354 is set high, scan-in data SI 364 is directed to input D 358 and output to Q/SO 360 upon the rising edge of clock signal CK 362. In this way, test data can be scanned into the internal circuitry of an IC.

The combinational logic 366 of the IC can then operate using such test data and the result can be stored in the same scan cells 350. For example, scan cells 350-1, 350-2, and 350-3 can be configured as a scan chain 368 where data is scanned in through SI 370 by shifting data from scan cell 350-1 to scan cell 350-2 and then to scan cell 350-3 using clock signal 374 when scan enable SE 372 is set high, which is known as Scan Shift Cycle. When all the test data is scanned in, scan enable SE 372 is set low and a test operation can be launched to operate combinational logic 366 under the desired test input. Upon completion of the test, results are stored in scan cells 350-1, 350-2, and 350-3 by applying a clock signal 374 when scan enable SE 372 is set low, which is known as Scan Capture Cycle. The test data can then be scanned out to scan out SO 376 through the use of clock CK 374 when scan enable SE 372 is set high.

With this fundamental understanding of scan testing, the problems associated with such testing can be better understood. As described above, one clock signal is used to drive the test circuitry. The frequency of this capture clock signal is fixed such that for any given test set for the given IC, only one set of test clock frequencies can be used.

With this limitation, a designer that is required to test a complex integrated circuit with many features is limited to one clock frequency for testing the entire circuit. In general, shift operations are performed at a slow speed in order to reduce excessive simultaneous switching noise that can cause shift operations to fail. More precisely, during the Capture Cycle, depending on the delays in the combinational logic 366, different clock frequencies can be used to capture signals at the functional speed. Test and scan pattern generation tools known as ATPG (Automation Test Pattern Generation) have a limitation to use more than one clock frequency for the given test set for the circuit under test (CUT). If a different clock speed is required, another test set for the CUT has to be created such that each clock speed requires its own test set for the CUT. These discrepancies limit the quality of test; add cost and complexity to the test, and provide non-ideal conditions for modern devices.

Where a clock frequency is low, certain circuitry within the IC may not be appropriately exercised. But in using a higher clock frequency, certain circuitry may be appropriately tested but certain other circuitry may be unnecessarily over tested. It may be the case that for this certain other circuitry, real-world applications would never similarly exercise the circuits in terms of speed. The result may, therefore, be that a designer is forced to use a clock frequency that assures proper operation of the whole circuit but that may unnecessarily overstress certain parts of the integrated circuit. When implemented at this clock frequency, some or many good ICs may be discarded. Conversely, some or many ICs may incorrectly pass.

Especially with the increasing complexity of modern chips with their increased functionality and higher operating speed, the use of one clock frequency for the testing of the entire IC may not be appropriate. Essentially, one test clock frequency may not be appropriate for all the cells in an IC. It is therefore desirable to have a scan application where the clock frequency may be adapted for testing of specific cells in an IC. For example, a highly complex cell that includes highly integrated digital signal processor circuitry may require a high test clock frequency to assure proper operation. But a less complex standard logic cell may not need to be stressed at high clock rates because it will never experience such stresses. In providing a test apparatus with a variable test clock frequency, an entire integrated circuit design process can be improved while assuring the at-speed functionality of the integrated circuits.

As test vector size increases, there are more demands to reduce test time while simultaneously maintaining the same or better test coverage. Because the scan test vector creates circuit disturbances during scan shift operation and test launch cycle, optimally, a slow speed shift operation is used during scan shift cycles. These disturbances are due to simultaneous switching activities cause by the shifting operation of scan data through the scan chain. During the at-speed scan test capture where time between the launch and the capture time is critical to detect at-speed delay defects, similar disturbances are also present. But for the test launch cycle to perform the at-speed test, reducing the test speed is necessary to avoid the simultaneous switching noises that would defeat the purpose of testing the device at-speed. The effects of the disturbances are often noted to the signal as a slow to propagate condition due to delays in switching circuitry from di/dt related ground noise and changes in slew rate from IR drop. These phenomenon starts to cause over test conditions during at-speed test using the scan vectors. Study of this issue shows that for the same signal path there are different signal propagation speeds due to the different simultaneous switching noises. A solution to this over test condition is to reduce a correct amount of delay caused by the disturbances from the at-speed launch.

BRIEF DESCRIPTION OF THE DRAWINGS

The foregoing and other objects, features, and advantages of the invention will be apparent from the following description of particular embodiments of the invention, as illustrated in the accompanying drawings in which like reference characters refer to the same parts throughout the different views. The drawings are not necessarily to scale, instead emphasis being placed upon illustrating the principles of the invention.

FIG. 13 illustrates the composition of a Waveform Generation Language (WGL) file according to an embodiment of the invention.

FIG. 16 illustrates a various input and output test vectors for implementing a variable test clock frequency according to an embodiment of the invention.

SUMMARY OF THE INVENTION

Figure 1:
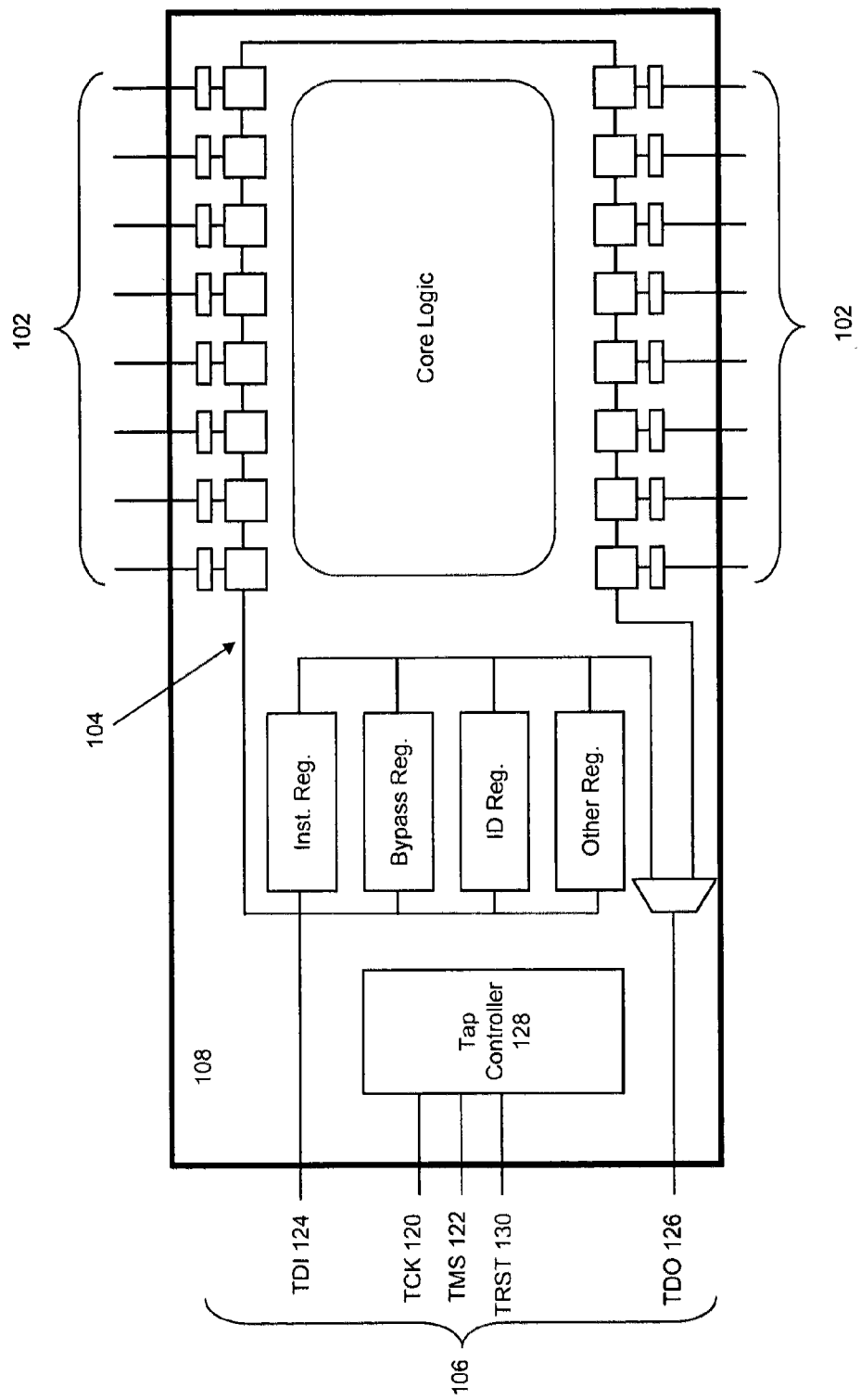
FIG. 1 illustrates a boundary scan architecture according to the prior art.
Figure 2:
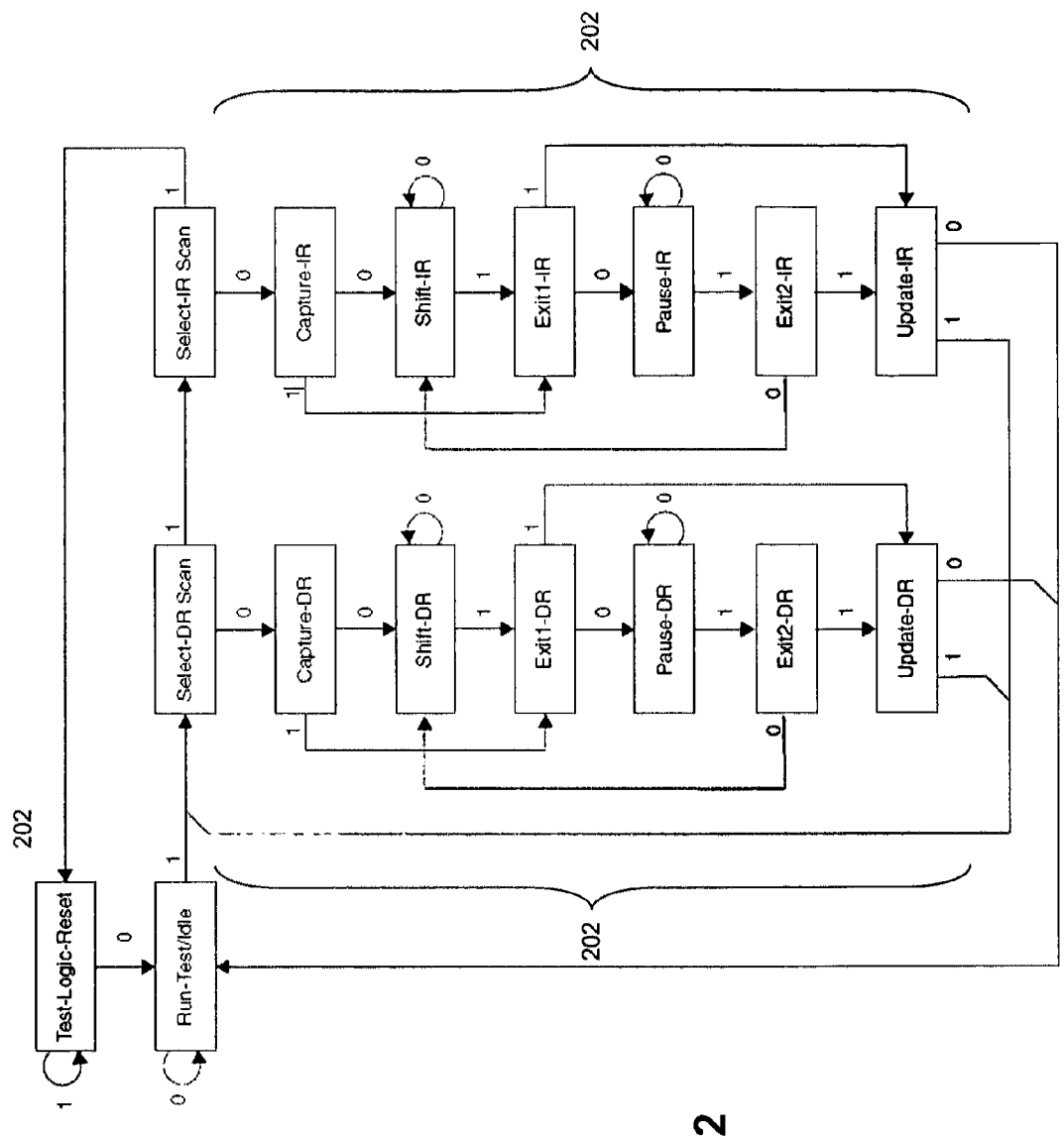
FIG. 2 illustrates a state transition diagram for a TAP controller.
Figure 3:
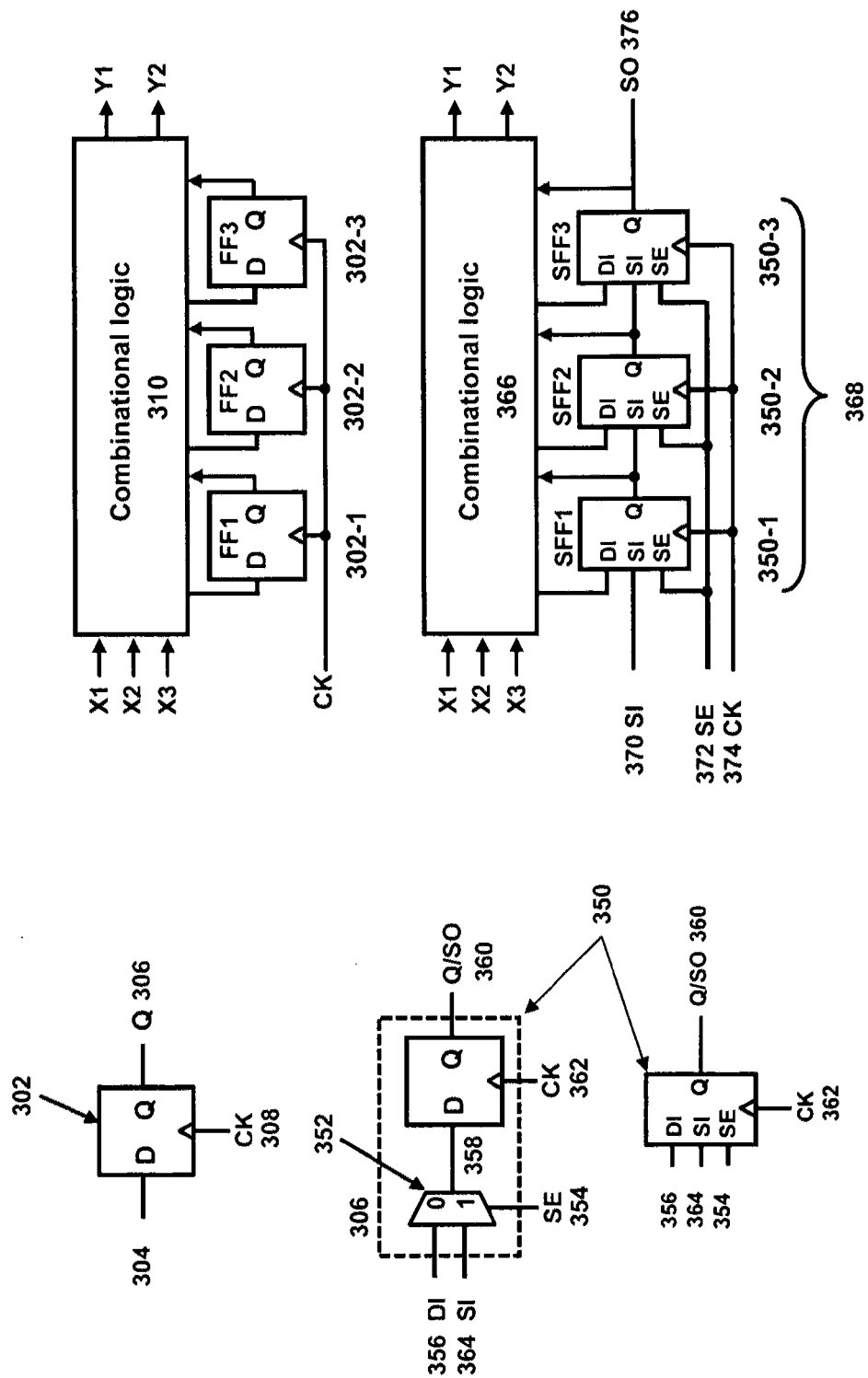
FIG. 3 illustrates configurations and implementations of storage elements and scan cells.

In an embodiment of the invention, variable test clock circuitry is provided within an integrated circuit desired to be tested. The variable test clock frequency implements a test clock control register that receives serial test data from a device tester and is configured to serially pass the received test data to scan test chains within the integrated circuit. The test clock control register stores test clock information. The test clock information is provided to a test clock generator where the test clock generator then produces test clock signals at a predetermined frequency. The test clock signal is then provided as a test clock frequency for the scan test chains within the integrated circuit.

In another embodiment of the invention, variable test clock circuitry is provided external to an integrated circuit desired to be tested. The variable test clock frequency implements a test clock control register within external circuitry such as an FPGA, PLD, CPLD, or other circuitry that receives serial test data from a device tester and is configured to serially pass the received test data to scan test chains within the integrated circuit. The test clock control register stores test clock information. The test clock information is provided to a test clock generator where the test clock generator then produces a test clock signal at a predetermined frequency. The test clock signal is then provided as a test clock frequency for the scan test chains within the integrated circuit through the test clock pins provided in the device under test.

Full use of the present invention is made by implementing test vectors, known as a test cycle, at appropriate test clock frequencies. By applying test vectors in this manner, an integrated circuit can be better assured of operating correctly by testing the device with a correct test frequency. It is, therefore, necessary to generate test vectors for use at predetermined test clock frequencies.

In an embodiment of the invention, test vectors are generated by performing an iterative process. A first set of test vectors is generated to operate at a first test clock frequency. The integrated circuit is then tested using the first set of test vectors responsive to the first test clock frequency and a first set of outlier cells of the integrated circuit responsive to the testing of the integrated circuit are identified. A second set of test vectors can then be generated responsive to the identified outlier cells. Here, the second set of test vectors is configured to operate at a second test clock frequency. Each test set consists of test vectors to identify similar groups of outliers in terms of test frequencies.

In making the test clock frequency programmable various design options become available that can be implemented at different stages of an integrated circuit design process. For example, in an embodiment of the invention, the availability of a variable test clock frequency during the RTL design process allows a designer to more quickly develop a design that can be passed to the RTL test insertion stage where design problems may be quickly analyzed using a variable test clock frequency for at-speed testing with ATPG tools. For example, critical circuit blocks may be identified that can then be modified by providing feedback to the RTL design phase.

Similarly, in another embodiment, gate-level synthesis may be more quickly completed where it is known that issues and problems can be quickly identified during a following gate-level synthesis and scan chain insertion stage that uses a variable test clock frequency to identify circuitry that may have issues or problems. In fact, information gained during testing performed using a variable test clock frequency may be fed back to any earlier stage of design. For example, in another embodiment, information gained using a variable test clock frequency during testing at during the package and test stage may be fed back to any earlier stage, for example, fabrication, placement and route, gate-level synthesis, and RTL design. Even after the device is in mass production, a variable test clock frequency can help identify the root cause of problems from field returns, over or under test conditions, and other process deviation-related failures during diagnosis and failure analysis activities. Information gained during testing performed using a variable test clock frequency for diagnosis and failure analysis may be fed back to the source of problems so that corrective action can be taken.

DETAILED DESCRIPTION

As integrated circuits have moved to leading-edge of nanometer designs, new types of defects are occurring. Also, because these designs are so highly integrated certain portions of the overall design may be cutting edge technology that must be analyzed and tested carefully whereas other portions of the overall design may be straightforward logic design that are not expected to be stressed during operation of the circuitry. It has been observed that a much higher proportion of the defects in nanometer designs are timing related when compared to earlier designs. New problematic defects now include high impedance shorts, in-line resistance, and crosstalk between signals, simultaneous switching noises, local IR drops, droops caused by ground bounce, and di/dt related power and ground noise, which are not always detected with the traditional static-based tests, known as stuck-at tests.

Unless a designer is able to properly identify problems with a design, defects per million (DPM) rates increase that are directly related to the cost and reliability of a product. Thus, as manufacturers move to smaller and smaller design nodes, improved testing schemes must be implemented.

Many of these newer defects, like resistive vias and bridges, exhibit defective timing behavior can be identified by conducting testing at system speeds (at-speed testing) as well as stuck-at tests.

At-speed and stuck-at testing are conducted on automatic test equipment (ATE). Whereas stuck-at testing can be implemented with a high level of coverage, at-speed test coverage can be difficult to determine and is usually much lower than stuck-at testing. An even more difficult problem is diagnosing the source of failure when functional tests fail. As part of the testing process, automatic test pattern generation (ATPG) tools provide fault models that can be used to generate tests targeting at-speed failures. As will be demonstrated, however, the availability of a variable test clock frequency allows for improved testing techniques.

Figure 4:
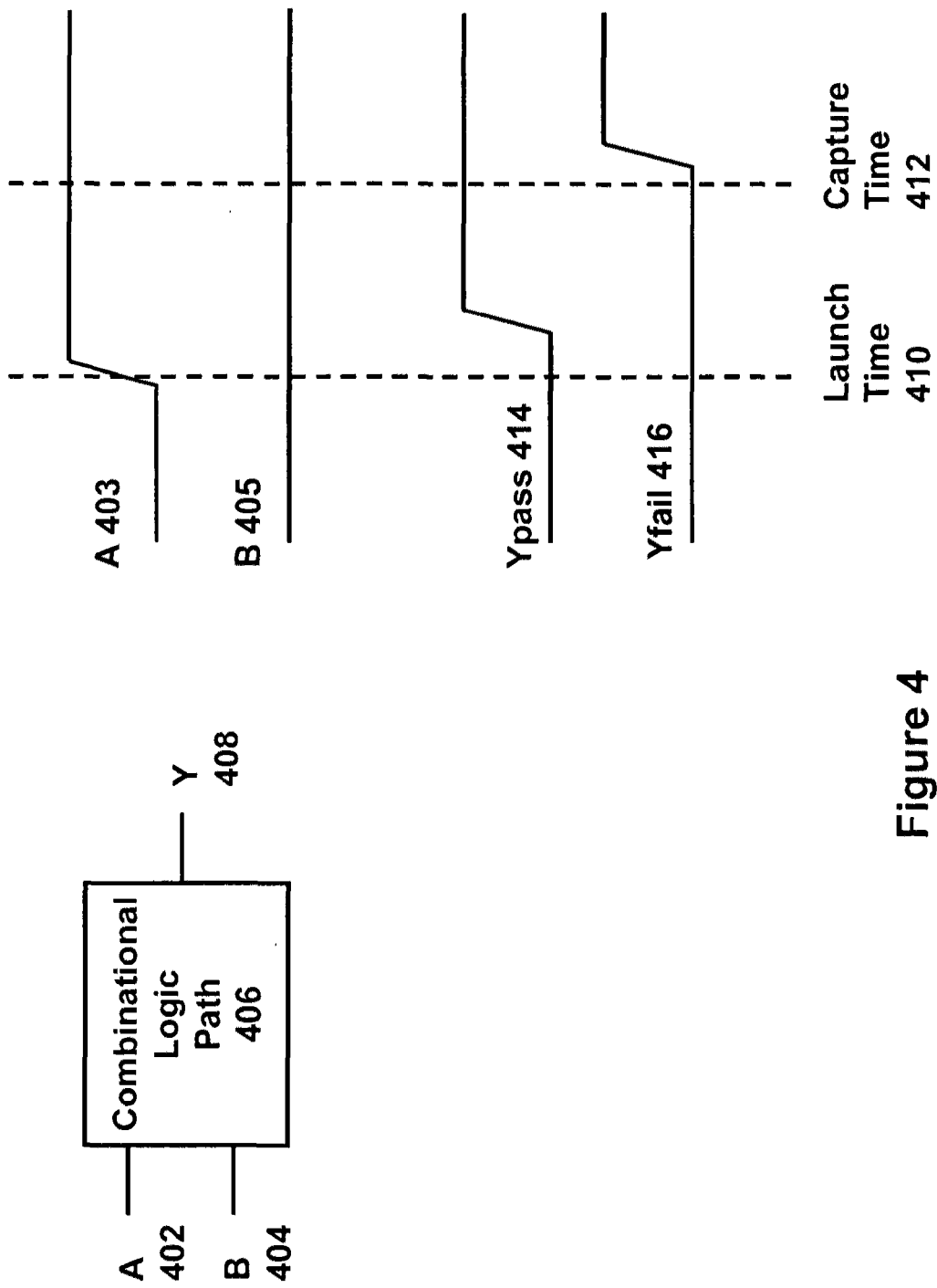
FIG. 4 illustrates the manner in which at-speed capture is performed.

Two common at-speed fault models include the path delay and transition delay models. At-speed testing utilizes a test pattern with a first part that launches a logic transition value along an identified path and a second part that captures the response at a specified time determined by the test clock frequency. For example, as shown in FIG. 4, signals A 402 and B 404 are inputs to a combination logic path 406 with Y 408 being an output of combination logic path 406. In an at-speed test, the inputs to A 402 and B404 are set prior to a launch time 410 shown as A 403 and A 405 of FIG. 4. At launch time 410, the combinational logic path is put into operation.

As shown, the operation of combinational logic path 406 after the launch time resulted in Y 408 transitioning from a low to a high state. At capture time 412, the test circuitry captures, that is stores, the then-present signal Y 408. The time difference from launch time 410 to capture time 412 is called the at-speed clock cycle and is determined by a test clock signal. As will be shown further below, the present invention provides for a variable test clock frequency that allows for variation of the at-speed clock cycle.

The captured response for Y 408 can then be used to determine whether the integrated circuit has operated correctly. For example, for Ypass 414, Y 408 properly transitioned from a high to a low within the at-speed capture time indicating a pass condition. But for Yfail 416, Y408 transitioned from a high to a low outside of the at-speed capture time indicating a fail condition.

The path delay fault model is also used to test for cumulative delays along a critical path that may be caused by manufacturing defects and process problems. In this model, static timing tools are used to identify critical paths. For certain identified critical paths, an ATPG tool creates tests patterns to exercise such paths. The ATPG tool can also test whether the inputted critical paths are actually used during normal operation of the integrated circuit. If the paths are not used, there is no need to test them. Using this type of testing, the operating frequency of an integrated circuit can be tested and verified. This type of testing can be conducted by adjusting the launch and capture sequence of the test.

Because the present invention makes available a variable test clock frequency, the need is created for improved ATPG tools that account for the variable test clock frequency. In an embodiment of the invention, ATPG tools iterate through various test vectors at various test clock frequencies to identify sets of test vectors with corresponding test frequencies. In this application, any one set of test vectors at one test clock frequency will not fully exercise an integrated circuit, but the full set of test vectors at their corresponding test clock frequency will assure proper operation of the complete integrated circuit while minimizing undesirable over- and under-test situations.

Figure 5:
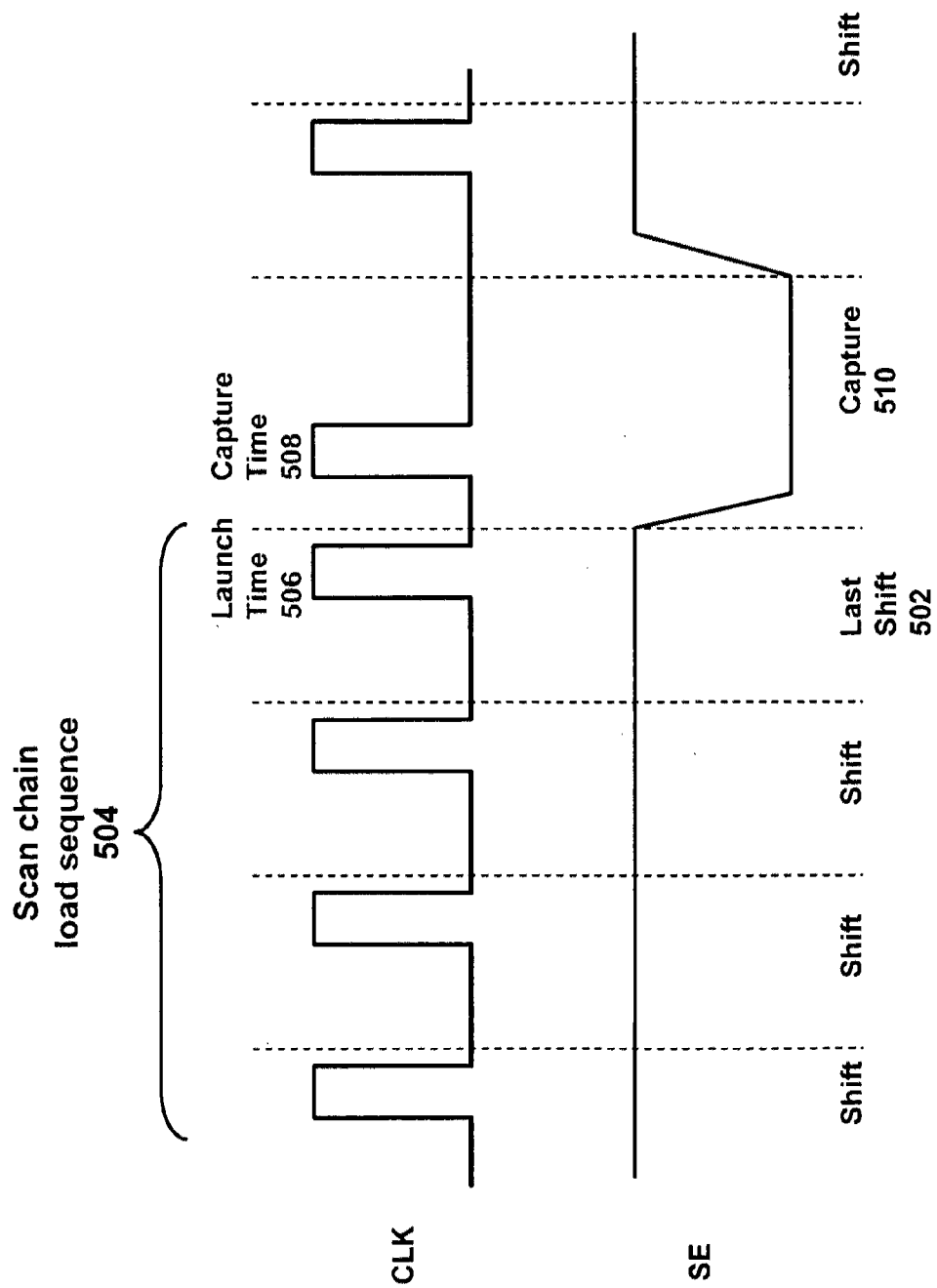
FIG. 5 illustrates a timing diagram for a launch off shift transition delay fault model.

In a transition delay fault model, the pins of an integrated circuit are tested for slow-to-rise and slow-to-fall characteristics. As shown in FIG. 5, a launch-off-shift transition delay test, the last shill 502 of a scan chain load sequence 504 provides the launch event 506.

Figure 6:
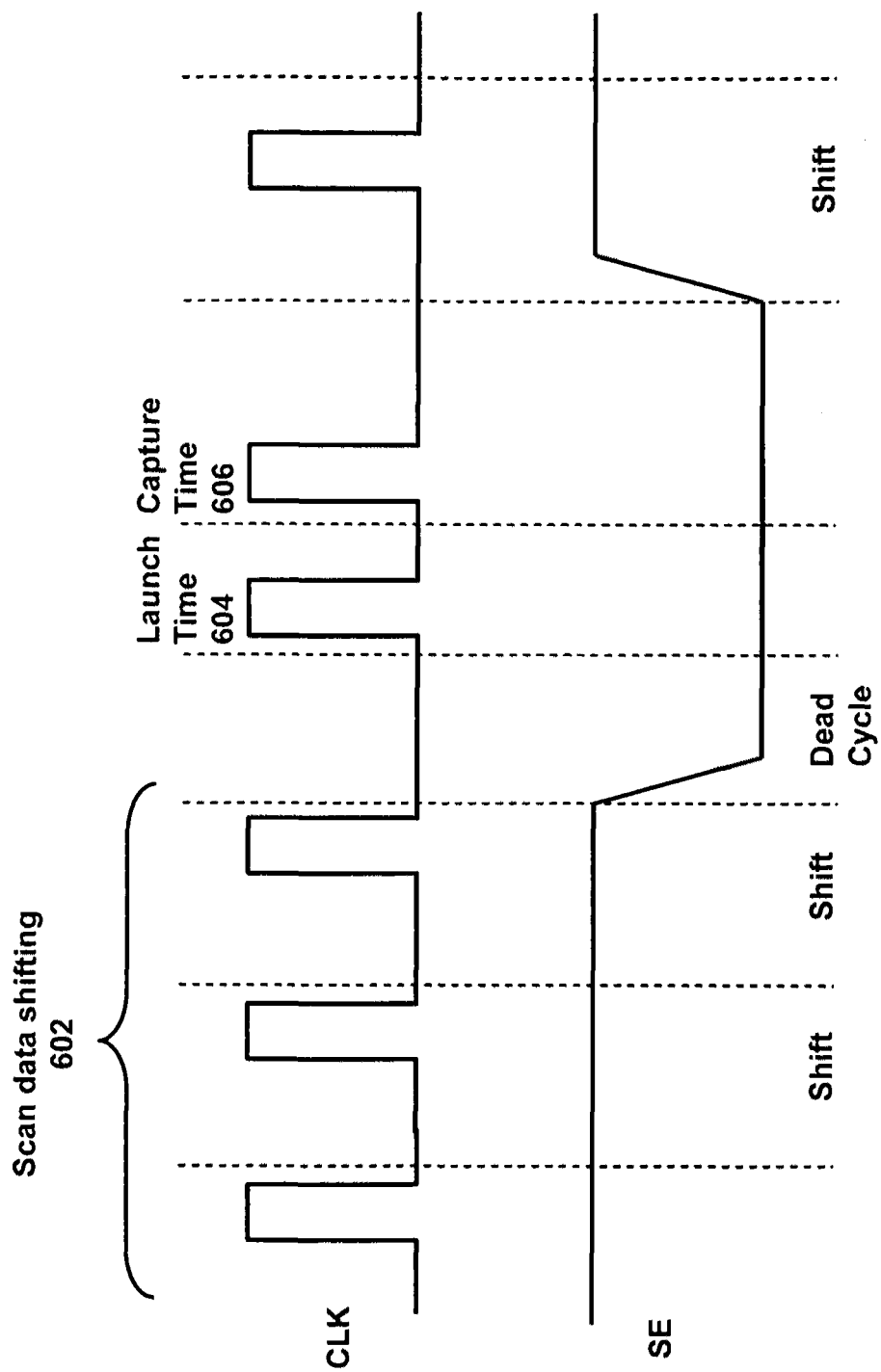
FIG. 6 illustrates a timing diagram for a broadside transition delay fault model.

Shown in FIG. 6 is another transition delay test called broadside where scan data shifting 602 is done at slow speeds and two at-speed clocks are used to specify a launch time 604 and capture time 606 in at-speed test mode that consists of two rising edges, launch and capture clock edges, respectively.

To date the test clock signal that determines the at-speed clock cycle has typically been fixed by the automatic test equipment (ATE) being used, thereby limiting the types of tests that could be conducted. The present invention, however, provides an apparatus and method for providing a variable clock frequency in a scan architecture for each test cycle.

Figure 7:
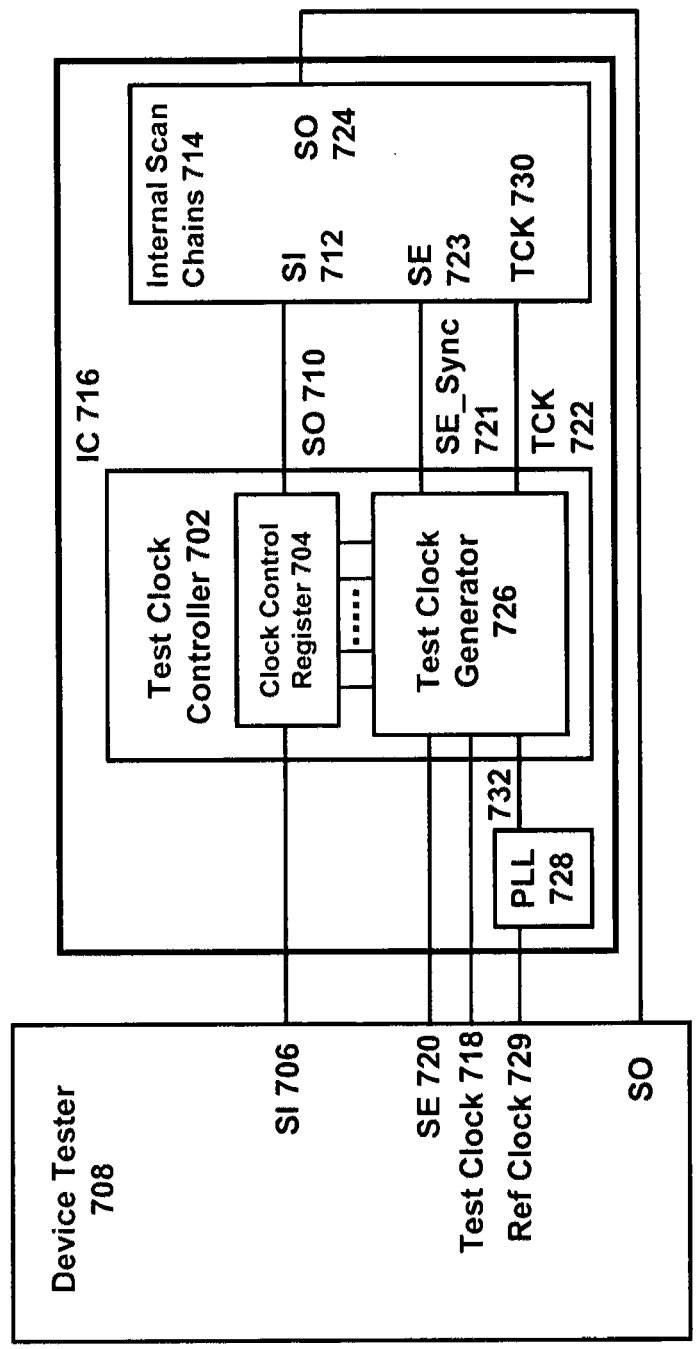
FIG. 7 illustrates a scan architecture that implements a variable test clock frequency within an integrated circuit according to an embodiment of the invention.

Shown in FIG. 7 is an embodiment of the present invention that implements a variable test clock frequency within an integrated circuit. As shown, test clock controller 702 includes clock control register 704 that receives serial input SI 706 from device tester 708. In operation, clock control register 704 is a shift register that receives SI 706 and shifts the received data through the registers of clock control register 704 until it is output through clock control register SO 710 to the SI input 712 of the internal scan chains 714 of integrated circuit 716.

Figure 8:
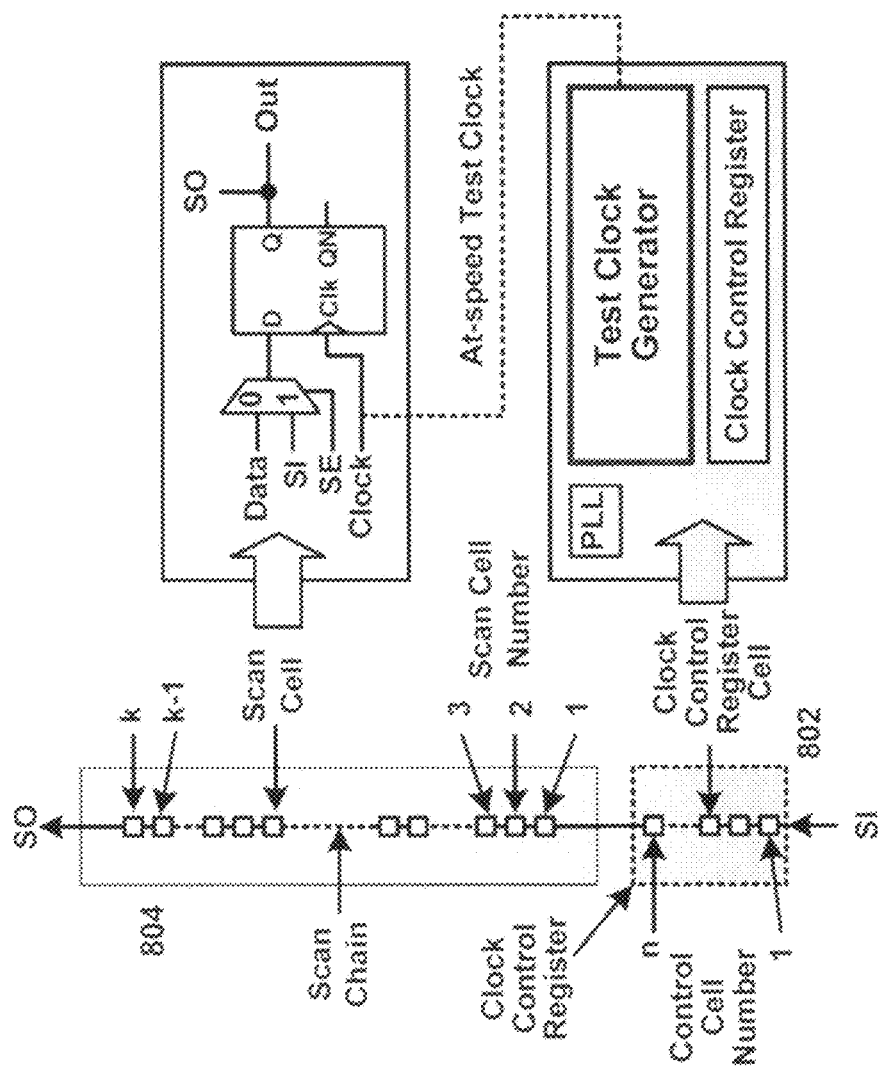
FIG. 8 illustrates a scan architecture that implements a variable test clock frequency within an integrated circuit according to an embodiment of the invention.
Figure 9:
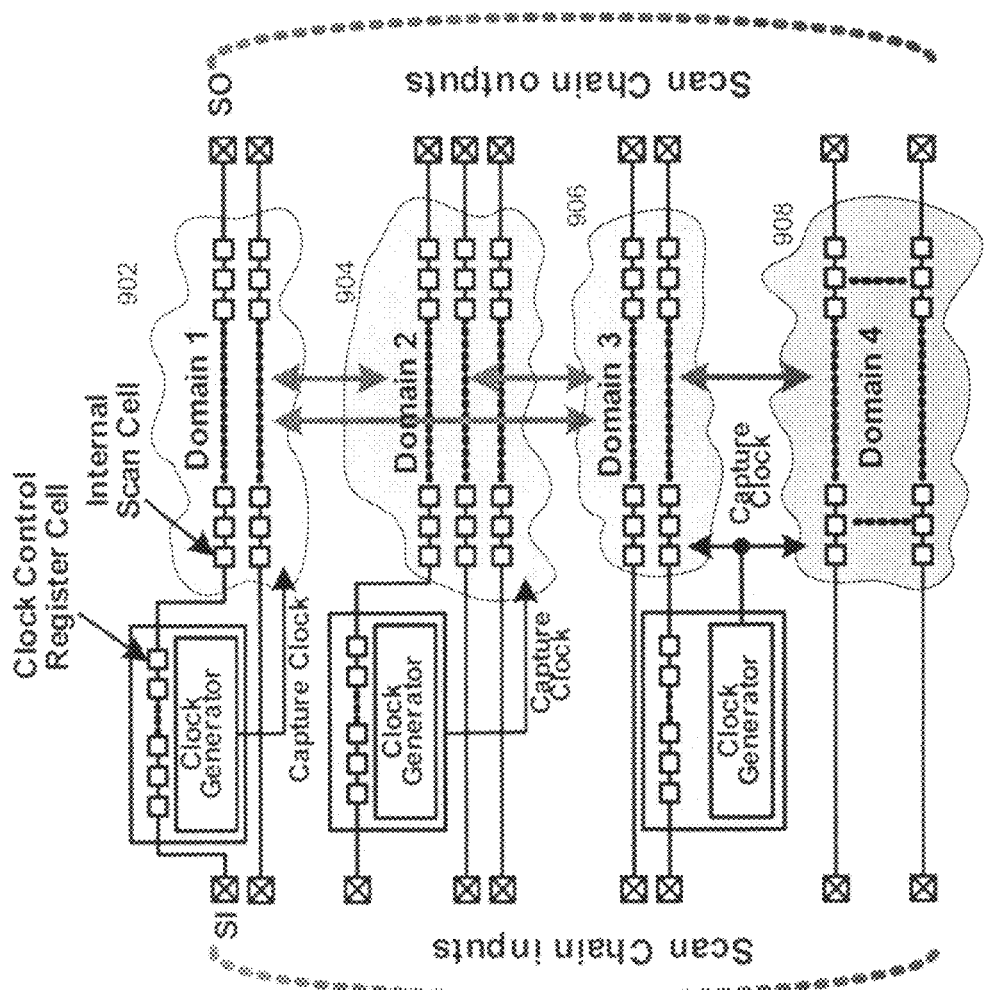
FIG. 9 illustrates a scan architecture that implements a variable test clock frequency within an integrated circuit with multiple clock domains and multiple clock generators according to an embodiment of the invention.
Figure 10:
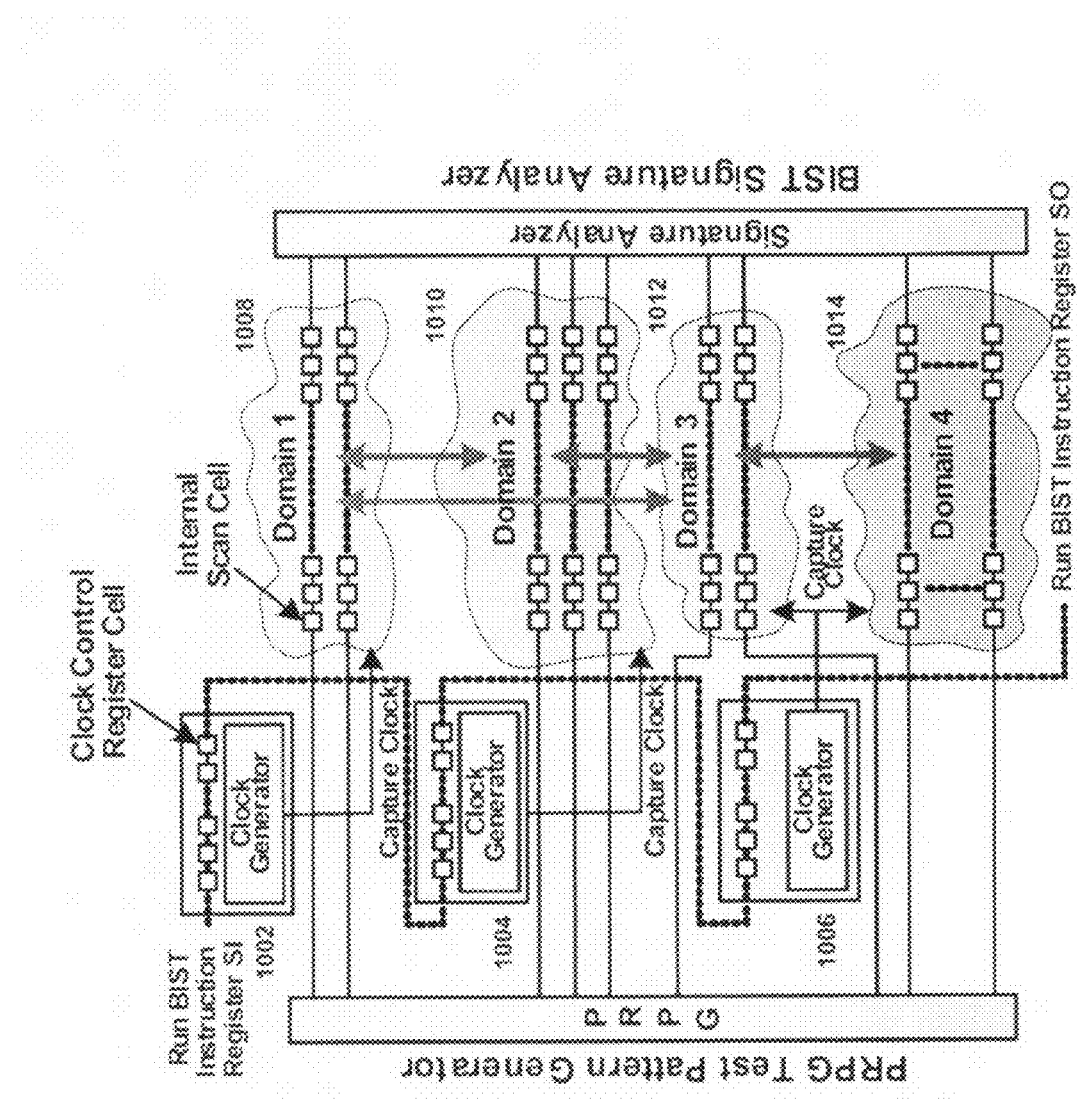
FIG. 10 illustrates a scan architecture that implements a variable test clock frequency within an integrated circuit with multiple clock domains and multiple clock generators according to an embodiment of the invention.

FIG. 8 provides a simplified representation of FIG. 7 that will assist in the discussion to follow. As shown in FIG. 8, block 802 represents the components of test clock controller 702 and block 804 represents the internal scan chain 714. Turning now to FIGS. 9 and 10, variations of the present invention will be described.

FIG. 9 provides an example of the present invention that implements multiple scan chains having different clock domains 902, 904, 906, and 908. As shown, the simplified representation of FIG. 8 is used to facilitate an understanding of the present discussion. The arrows between the clock domains represent signals crossing the different clock domains. Among other things the following is shown within FIG. 9:

(1) within the same clock domain, one clock generators can be shared;

(2) within the same clock domain, multiple clock Generators can be used, e.g., Domain 902 and Domain 904 can be the same clock domain (called intra-clocking with synchronous clock domains or the same clock domains);

(3) where signals cross between different clock domains, inter-clocking (with asynchronous clock domains) can be done to take full advantage of delay requirement;

(4) depending on the direction of the signal from the asynchronous clock domains, capture clock speeds can be programmed differently (a difficult part of at speed testing between asynchronous clock domains but the present invention can be used to fine tune inter-clock domain at-speed test issues);

(5) debugging between synchronous or asynchronous clock domains is greatly enhanced by being able to adjust independent capture timings using the present invention.

FIG. 10 depicts an integrated circuit implementing LBIST instead of an ATPG-based internal scan implementation. Logic BIST is often executed by the Boundary Scan RUN_BIST instruction when TAP is in the RTI (Run Test Idle) state. Once the RUN_BIST instruction is issued from the TAP, LBIST runs a BIST operation autonomously until the end of the test is reached and TAP can read out a signature (BIST run pass or fail result) by performing a shift DR operation in a similar way as in scan shift.

In an embodiment of the present invention, clock generators 1002, 1004, and 1006, are added as in ATPG based scan approach. In this way, test clock information can be passed through the various clock circuits so as to appropriately test an integrated circuit having different timing domains 2008, 1010, 1012, and 1014.

In order to implement the embodiment of FIG. 10, it may be necessary to create intermediate instructions for boundary scan testing beyond those currently available. For example the following may be implemented:

RUN_BIST (Continue_to_Cycle_#, Capture_Time_1, Capture_Time_2, Capture_Time_3, - - -)

BIST_CONTINUE (Continue_to_Cycle_#, Capture_Time_1, Capture_Time_2, Capture_Time_3, - - -)

BIST_END (place chip into safe state, read out signatures)

RUN_BIST is a command to initiate testing that provides flexibility for implementation of the present invention. For example, as shown above, the RUN_BIST command is specified to continue until a certain cycle is reached. The RUN_BIST command as shown also specifies the capture times to use. Because the RUN_BIST command pauses the tests being performed, it is, therefore, necessary to be able to restart the test such as may be done with the BIST_CONTINUE command that similarly specifies how long the BIST is to proceed and which capture times to use. When the RUN_BIST instruction completes "Continue_to_Cycle_#," the BIST halts the operation of all BIST functions and maintains all last operation status such that when the BIST_CONTINUE instruction is subsequently issued, the BIST can resume operation suspended by the previous BIST command. It will be the same for the BIST_CONTINUE instruction when multiple BIST_CONTINUE instructions are issued sequentially. The BIST_END instruction will be the last instruction to place the chip into safe state and readout the final signatures. Finally, at the completion of BIST, BIST_END can be executed where the IC is placed in a safe state and signatures are read out. Thus, with enhanced instructions and enhancements to LBIST control logic, BIST can be executed incrementally with different clock speeds.

Figure 11:
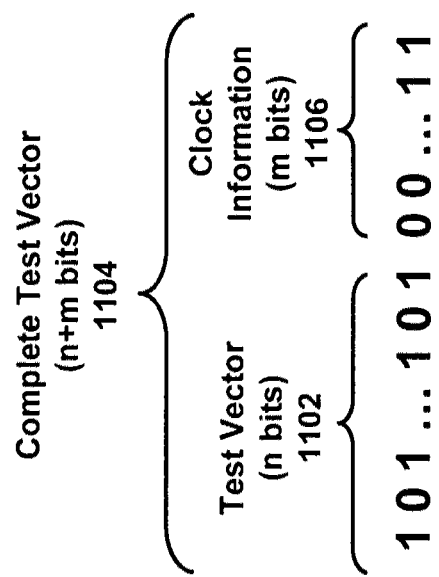
FIG. 11 illustrates the composition of a complete test vector that is n+m bits long where n bits correspond to a stimulus pattern and m bits correspond to clock information according to an embodiment of the invention.

In order to implement clock control register 704 of FIG. 7, a scan vector includes information to be held in clock control register 704. For example, as shown in FIG. 11, where a test vector 1102 for a given IC may be n bits long and where the clock control register information 1106 is m bits long, the length of the complete test vector 1104 as generated by device tester 706 is then n+m bits long. In the embodiment shown in FIG. 11, the m bits for clock control register 704 are the last m bits of the complete test vector 1104 as an example.

When implemented in this manner, as shown in FIG. 11, test data 1102 which is the first n bits of complete test vector 1104 are shifted through clock control register 404 and into the various scan cells of the integrated circuit. As the final of the m bits of the complete test vector 1102 are shifted through, the m bits of clock control register information 1106 are input. When the complete test vector 1104 is input, n bits reside in the registers of the integrated circuit and m bits reside in clock control register 704. The integrated circuit, therefore, has the desired test vectors and clock control register 704 has the desired clocking information.

At this point, testing can proceed using the variable clock speed identified by the clock control register information and setting scan enable SE 720 to a logic high. Test clock generator 726 receives SE 720 and generates a scan enable synchronization signal SE_Sync 721 that is passed to the scan enable input SE 723 of the internal scan chains 714 of IC 716. Scan enable synchronization signal SE_Sync 721 is provided so as to adjust timings between device tester 708 and internal scan chains 714. For example, SE_Sync 721 can be used to compensate for any timing delays associated with test control controller 702.

In application, the clock speed of TCK 722 may be faster or slower than the standard available test clock 718 available from device tester 708. PLL 728 output and test clock 718 are used as an input to test clock controller 702 for exemplary purposes, but practical scan test applications may use internal multiplexers available in PLL 728 during the scan test mode to avoid unnecessary clock skews to the PLL-generated functional clock signal lines.

When testing is complete and information is desired to be shifted out of the integrated circuit, the clocking signal TCK 722 is applied to the registers of the integrated circuit and the clock control register 704. Simultaneously, a new complete test vectors may be input. In order to fully shift in new test and clock data, it is necessary to perform at least shifts. Test clock controller 702 bypasses the shift clocks provided by device tester 708 during scan data shifting, cycle 602 such that pass/fail comparison during shift operation by device test 706 is synchronized and unchanged. Test clock controller 702 generates launch time pulse 604, capture time pulse 606, and SE_Sync signal 721 from SE 720 when SE 720 signal is in a low state corresponding to capture 512.

In an embodiment of the invention, the clock control register information is included as the last m bits of the n+m bits of the complete test vector. In another application, the clock control register information may be included as the first m bits of the n+m bits of the complete test vector. In this application, test clock controller 702 and its components would be moved to receive serial data as SO 724 exits the registers of the integrated circuit. In yet another application, the clock control register information may be included in the middle of the n+m bits of the complete test vector. For example, where multiple integrated circuits are configured in a chain, the clock control register information may be formatted so as to be available before or after the input or output of an integrated circuit's registers. Other variations would be available to one of ordinary skill in the art upon understanding the teachings of the present invention.

The m bits of clock control register 704 are used to provide information to test clock generator 726. The m bits of information can then be used by test clock generator 726 to generate a test clock at a predetermined frequency. Test clock generator 726 may be implemented in various manners known to one of skill in the art. For example, in an application, test clock generator 726 may have m predetermined clock frequencies that were identified by a designer. The m bits from clock control register 704 can then be used to select among the m predetermined clock frequencies. A designer can then appropriate clock frequencies as needed—faster or slower as necessary.

In another application, test clock generator 726 may be configured to generate signals uniformly across a predetermined frequency range. In this type of application, for a three-bit clock control register signal, for example, eight equally spaced frequencies can be generated. A designer may then be able to incrementally test clock frequencies toward finding an optimum speed either by decreasing or increasing by the predefined unit frequency intervals where the center of clock control register value is preferably the predetermined optimum at-speed test frequency.

In yet another example, PLL 728 is provided to make use of a reference clock signal 729. The signal 732 from PLL 728 is then made available to test clock generator 726. Test clock generator 726 can then utilize PLL signal 732 to generate test clock signal TCK 722 at various frequencies using techniques known in the art. For example, test clock generator 726 may generate frequencies that are multiples (e.g., ¼, ½, 1, 2, 4, etc.) of the frequency of PLL signal 732. These applications of test clock generator 726 are intended to be only examples with many more possibilities being available to one of skill in the art.

The present invention may be included in an integrated circuit as described above with reference to FIG. 7 but may also be implemented using components that are external to an integrated circuit.

Figure 12:
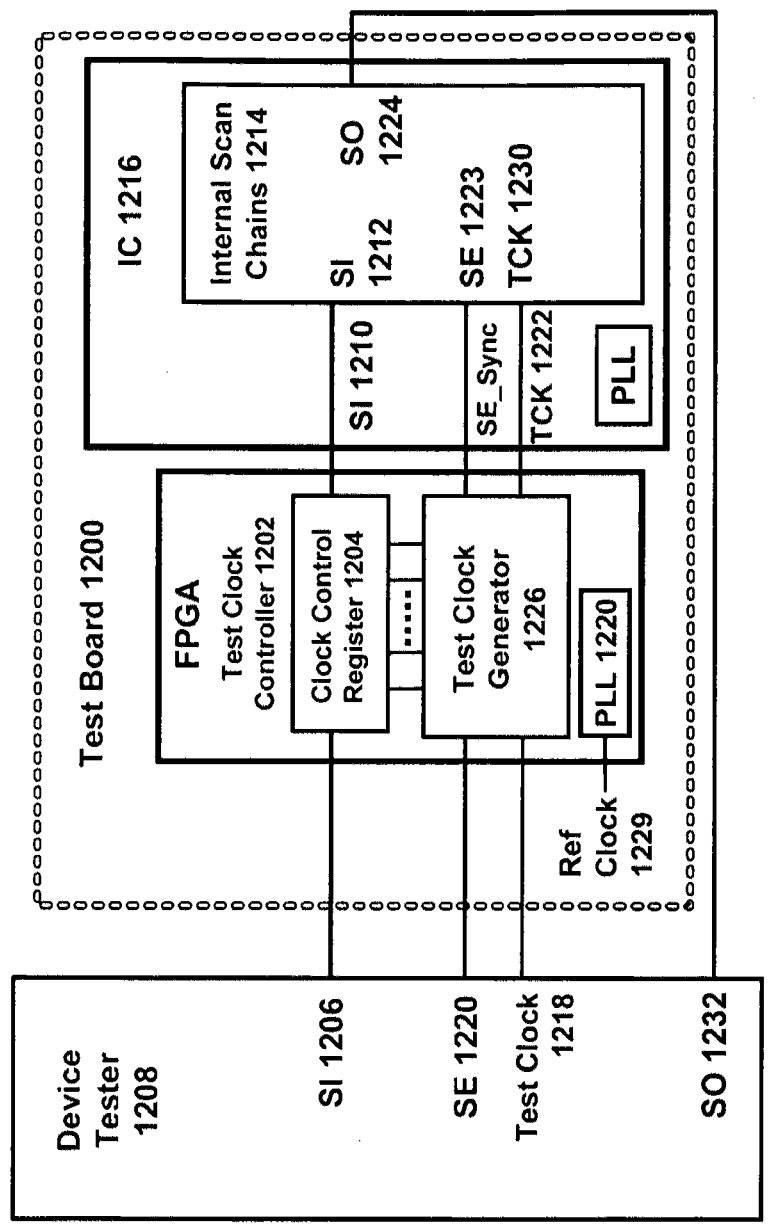
FIG. 12 illustrates a scan architecture that implements a variable test clock frequency within a Field Programmable Gate Array (FPGA) that is outside of an integrated circuit according to an embodiment of the invention.

Shown in FIG. 12, is an embodiment of the present invention that implements a variable clock frequency using components external to an integrated circuit. This embodiment of the invention allows legacy circuits to make use of the benefits of variable speed scan capture techniques according to the present invention. For this embodiment it is assumed that the IC to be tested at least has proper internal scan structures. When fully implemented, however, the variable speed scan capture techniques of the present invention can be utilized in legacy products. For example, with proper test vectors that include variable speed clock information, the legacy device can be tested at different speeds to better identify problems during device test, diagnosis, and debug operations.

In an embodiment, this operation is accomplished by modifying Summit Design's Waveform Generation Language (WGL) format to match the implemented functionality of variable speed scan capture. Since the WGL format is widely used and available for the device tester, adding functionality to support the changes necessary for the present invention are straightforward. Shown in FIG. 13 is a representation of a WGL vector file. As shown the WGL vector file includes an expected output pattern 1302. For purposes of an example, output pattern 1302 may represent the output a scan chain 7 for a vector #2. The WGL, vector file also includes an input test pattern 1304 that contains all the necessary information to run a scan test. For purposes of the same example, therefore, input test pattern 1304 includes the input vector for scan chain 7 for a vector #2. WGL vector file can, therefore, be modified to include information for the variable test clock frequency among other things. The expected output pattern 1302 contains 12 bits of no compare Xs and the input test pattern 1304 has 12 bits of clock control register value of 001100110111, both at the beginning of the vector sequence as an example.

There can be certain limitations depending on number of scan chains, PLL utilizations, number of clock domains, and at speed capture speeds. The availability of design information also plays a role since new ATPG can be performed as if it is a new design by incorporating the teachings of the present invention into the ATPG process mentioned earlier. If no new ATPG is needed, to improve at-speed test coverage with existing vectors, over-test and under test conditions can be analyzed so as to set appropriate clock frequencies in the present invention. Once clock frequencies are determined, such clock frequencies can be implemented according to the teachings of the present invention. In this way, the WGL files with new variable test clock frequencies can be used without generating new test vectors.

In an embodiment of the present invention, an FPGA is used to implement the functionality of test clock controller 1202 as is implemented on a test board external to the integrated circuit between a device tester and the integrated circuit. Test clock controller 1202 is implemented within an FPGA to include clock control register 1204 that receives input from SI 1206 as described previously. In operation clock control register 1204 is a shift register that receives SI 1206 and shifts it through the registers of clock control register 1204 until it is output to the SI 1212 input of an integrated circuit.

In order to implement clock control register 1204 of FIG. 12, a scan vector includes information to be held in clock control register 1204 within an FPGA. For example, where a test vector for a given IC may be n bits long and where the clock control register 1204 is m bits long, the length of the complete test vector as generated by device tester 1208 is then n+m bits long. In the embodiment shown in FIG. 12, the m bits for clock control register 1204 are the last m bits of the test vector. In shifting vectors in and out of the IC under test, an additional m bits must be shifted out in the present invention as compared to the prior art scan test.

The m bits of clock control register 1204 are then used to provide information to a test clock generator 1226 portion of the FPGA. The m bits of information can then be used by test clock generator 1226 to generate a test clock at a known frequency. Test clock generator 1226 may be implemented in various manners known to one of skill in the art. For example, FPGA's have grown in functionality a complexity to the point that many now include clocking circuitry. In such a situation, a test clock generator may be implemented within the FPGA utilizing the internal clocking circuitry.

Also, because certain circuitry is to be implemented outside of the integrated circuit, a clock or timing input may be provided that is external to the integrated circuit and the test clock controller. Still in another embodiment of the invention, reference clock signal 1229 is provided to PLL 1220 within the FPGA from which clocking signals at various frequencies may be generated.

Furthermore, as implemented for the circuit of FIG. 12, for example, in one application, test clock generator 1226 may have m predetermined clock frequencies that were identified by a designer. The m bits from clock control register 1204 can then be used to select among the m predetermined clock frequencies. A designer can then appropriate clock frequencies as needed—faster or slower as necessary.

In another application, test clock generator may be configured to generate signals uniformly across a predetermined frequency range. In this type of application, for a three-bit clock control register signal, eight equally spaced frequencies can be generated. A designer may then be able to incrementally test clock frequencies toward finding an optimum speed either by decreasing or increasing by the predefined unit frequency intervals where center of clock control register value being the predetermined optimum at-speed test frequency. In yet another example, PLL 1220 is provided. The signal from PLL 1220 is then made available to test clock generator 1226. Test clock generator 1226 can then utilize the PLL signal to generate clock signals at various frequencies using techniques known in the art. For example, test clock generator 1226 may generate frequencies that are multiples (e.g., ¼, ½, 1, 2, 4, etc.) of the frequency of the PLL signal. These applications of test clock generator 1226 are intended to be only examples with many more possibilities being available to a designer.

A desirable application of a variable clock frequency using components external to an integrated circuit is a situation where the teachings of the present invention relating to variable test clock circuitry can be implemented where in circuitry that does not provide such support internally within the IC. This is suitable for legacy devices that are currently in production and require variable test clock circuitry to enhance at-speed test quality.

In general, the apparatus of the present invention allows for implementing variable test clock frequencies. With this as a tool available to a person of skill in the art, many methods of implementing scan tests become available. To be described below are some such techniques and methods which are intended to be examples which do not limit the scope of the present invention.

Figure 14:
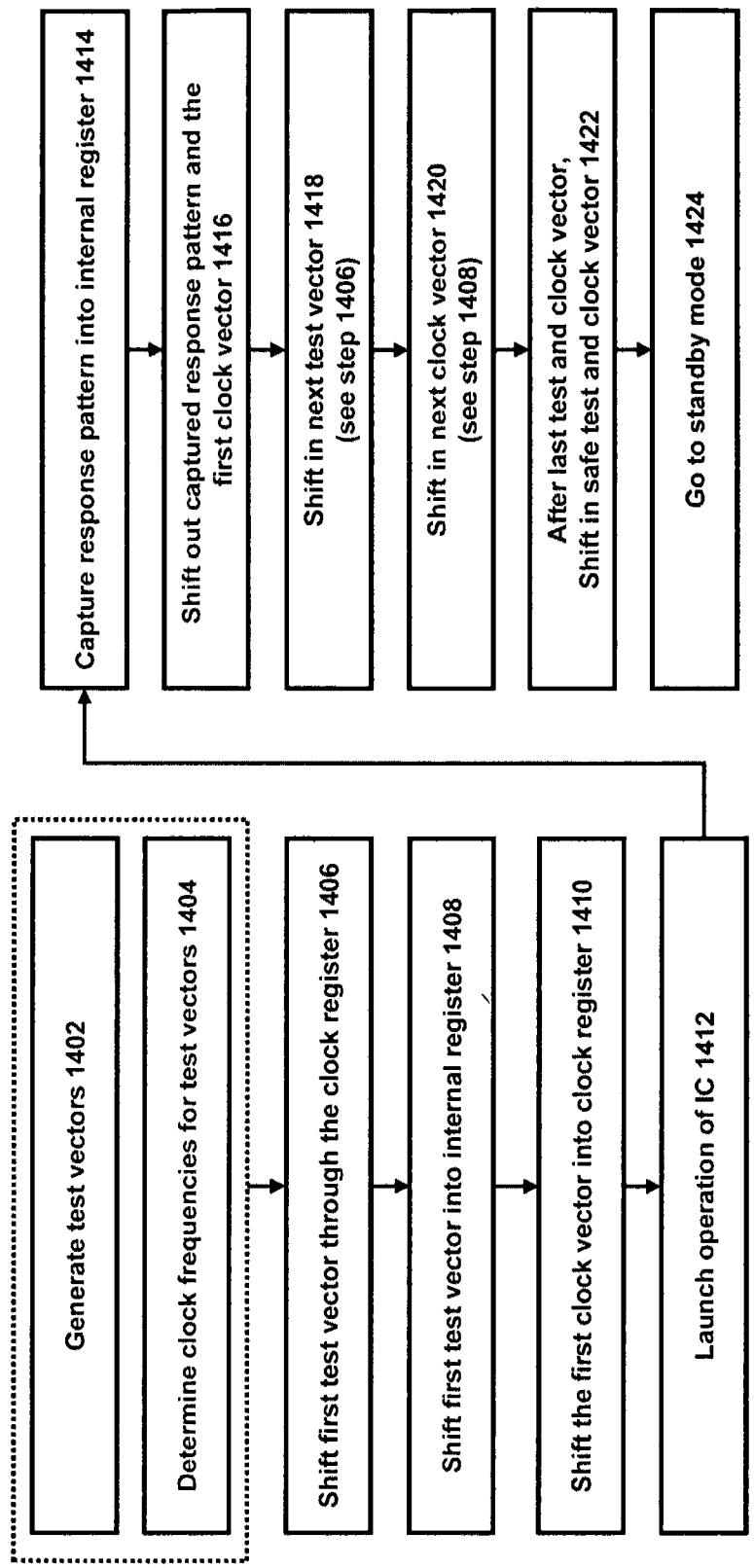
FIG. 14 illustrates a test vector generation and application for implementing a variable test clock frequency using a scan architecture according to an embodiment of the invention.

Shown in FIG. 14 is an algorithm for performing internal scan testing according to an embodiment of the present invention. As shown at steps 1402 and 1404, test vectors and their corresponding clock frequencies need to be determined. The process for generating these test vectors and identifying appropriate clock frequencies can be implemented using ATPG tools that are configured to vary a test clock frequency and the step 1402 and 1404 can be mixed in one step or in any order depending on the algorithms and approaches used during ATPG and clock frequency determination process. Among other things, an ATPG tool should consider problematic areas that may present over- or under-test conditions when only a fixed test clock frequency is available. This will be addressed further below.

As shown at step 1406 for an embodiment of the invention, a first test vector is shift into and through the clock control register. At step 1408, the first test vector is shifted into the internal register of the integrated circuit as the test vector exits the clock control register. Upon completion of the shift operation, the first stimulus pattern in shifted into the internal register as shown in step 1408 and the first clock vector is shifted into the clock control register as shown in step 1410.

In an embodiment of the invention as shown at step 1412, operation of the IC is launched so as to execute the desired test. Upon completion of the internal scan test, the resulting response pattern can be loaded into the internal test register of the integrated circuit as shown at step 1414. The process can then proceed to shift out the capture response pattern and the first clock vector as shown at step 1416. The present invention, therefore, requires at least additional m shifts, the length of the clock vector, to perform a complete shift out operation.

It is noted that at least m shifts are necessary because more shifts may be necessary to compensate for any delays introduced by the clock controller circuitry of the present invention. For example, one additional extra shift may be necessary when using) an additional pipeline register for synchronizing the scan operations to compensate for computation and settling time issues associated with the clock generators.

While shifting out the captured response pattern and the first clock vector at step 1416, a next test vector and a next clock vector can be simultaneously shifted into the test circuitry as shown at steps 1418 and 1420, respectively. Steps 1418 and 1420 are similar to steps 1406 and 1408, respectively.

After a last test and clock vector are applied to the integrated circuit, the final captured data can be shifted out and a safe test and clock vector are shifted into the circuitry as shown at step 1422. Finally, the IC is placed into a standby mode as shown at step 1424.

One of skill in the art understands that today's modern integrated circuit implement highly sophisticated and sensitive circuitry. In many cases, however, other more simple and straightforward circuitry is also implemented within the same integrated circuit. Likewise, circuitry of intermediate sophistication and sensitivity may be implemented within the same integrated circuit. To date, however, in choosing a test clock frequency a designer was limited to only one test clock frequency.

Using this single test clock frequency, a designer must assure that the complete integrated circuit operates as designed. Unfortunately, this limitation to a single test clock frequency has led to over-test conditions for certain circuitry within an integrated circuit. An over-test situation arises when parts of an integrated circuit are tested more rigorously than necessary. In doing so, it can be expect that more integrated circuits are incorrectly designated as failed—essentially a false positive situation. Conversely, with only one test clock frequency available, certain circuit blocks may be under-tested, meaning that they were not tested rigorously enough leading to a false negative situation. In an under-test condition, the integrity of the IC cannot be fully known such that more field failures are observed.

These situations can occur in the following exemplary conditions. Within a given integrated circuit there may exist one cell that is highly sensitive to the test clock frequency being used and very often cause a scan test to fail. At the same time, there may be other cells that are much less sensitive to the test clock frequency being used and rarely cause a failure. Also, there may be yet other cells that are somewhere in between in terms of sensitivity. Just as certain cells may be sensitive to a test clock frequency, they may also be sensitive to the particular test vectors being used.

Figure 15:
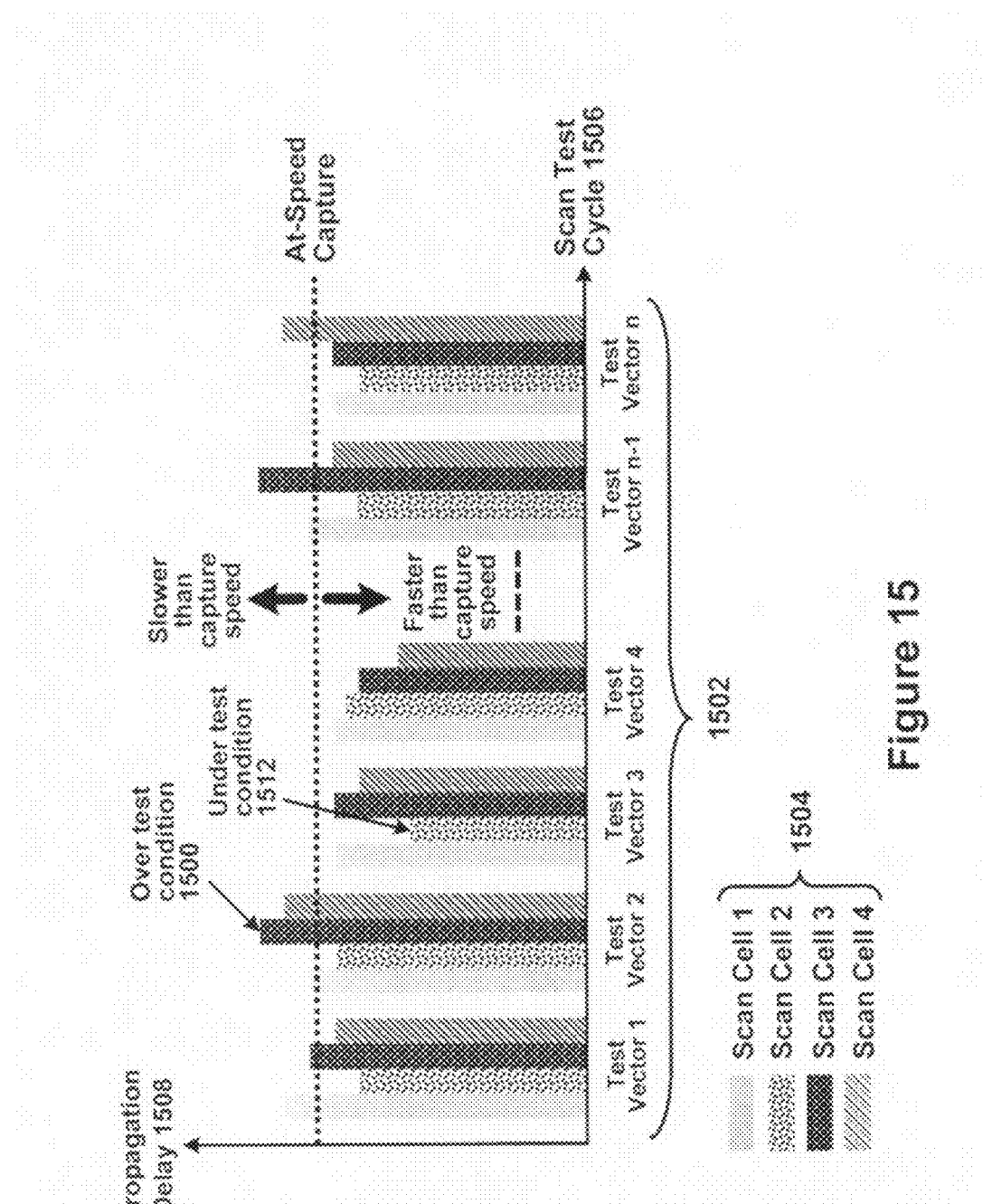
FIG. 15 illustrates the results of scan tests that reveal outliers that indicate over-test and under-test conditions according to an embodiment of the invention.

This situation is graphically represented in FIG. 15. As shown, various test vectors 1502 are implemented for various scan cells 1504 during several scan test cycles 1506. In comparing the results to at-speed capture, it may be observed that for certain cells implementing certain test vectors, the propagation delay 1508 may be faster or slower than at-speed capture. For the cell/test vector combination that is slower than at-speed capture, for example test 1500, an over-test condition exists, meaning that the given cell is being tested more rigorously than necessary to assure proper operation. Conversely, for a cell/test vector combination that is faster than at-speed capture, for example test 1512, an under-test condition exists, meaning that the given cell is not being tested rigorously enough to assure proper operation.

Both over-test and under-test situations are undesirable. For example, an over-test condition may result in an unnecessarily high number of integrated circuits being identified as failed chips. Among other things, this false positive situation reduces yield and increases overall operating costs. Also, an under-test condition may result in certain integrated circuits being identified as passed ICs when, in fact, they may exhibit problems in the field. In this false negative situation, field failures may be observed that are expensive to remedy and reduce customer satisfaction. It is these outliers of the over- and under-test conditions that cause the majority of problems in a design process. Through the use of the present invention, these outliers may be identified and separately tested.

For example, for over-test condition 1500, the test clock frequency can be reduced to find an optimum clock frequency that assures a properly operating integrated circuit. Likewise, for under-test condition 1512, the test clock frequency can be increased to find an optimum clock frequency that assures a properly operating integrated circuit.

A complete test may then include application of several test clock frequencies applying several test vectors during several tests. During the various tests using various test clock frequencies and test vectors, only certain cells may be of interest for any given test at a given test clock frequency and given test vector, while the results of other cells may not be of interest. In such a situation, the results from cells that are not of interest may be masked as "don't care conditions" such that only a limited number of results may be of interest.

For example, as shown in FIG. 16, a complete test vector is n+m bits long, but where only certain cells are of interest, the results of such cells can be compared to an expected value and all other results ignored (e.g., don't care conditions). In the example of FIG. 16, the complete input and expected output test vectors 1602 and 1604, respectively, are 11 bits long where the test stimulus pattern is the first 7 bits and the clock control register information is 4 bits. As shown for input test vector 1606, the first test clock frequency to be used is specified by the bit pattern 0101 (the last four bits of input test vector 1606).

As further shown in FIG. 16, the results of a scan test implementing input test vector 1606 are shown as expected output vector 1608. Notably, the bit pattern for the clock frequency is specified as a don't care condition in expected output vector 1608. Also, certain cells that are not of interest are specified as don't care situations. For these situations, an embodiment of the invention specifies safe inputs that will not detrimentally affect the circuit and that will not negatively affect the outputs of interest. As indicated in output vector 1608, three bits are of interest for the results of input test vector 1606.

Expected output vector 1612 specifies the expected circuit results for input test vector 1610. Similarly as before, the bit pattern for the clock frequency is masked as well as certain portions of the circuit with only certain portions being of interest. Input test vector 1614 and expected output vector 1616 exercise different portions of the integrated circuit being tested. An entire integrated circuit is, therefore, completely exercised through a combination of input test vectors 1602 that exercise the circuits in different manners with different test clock frequencies.

Figure 17:
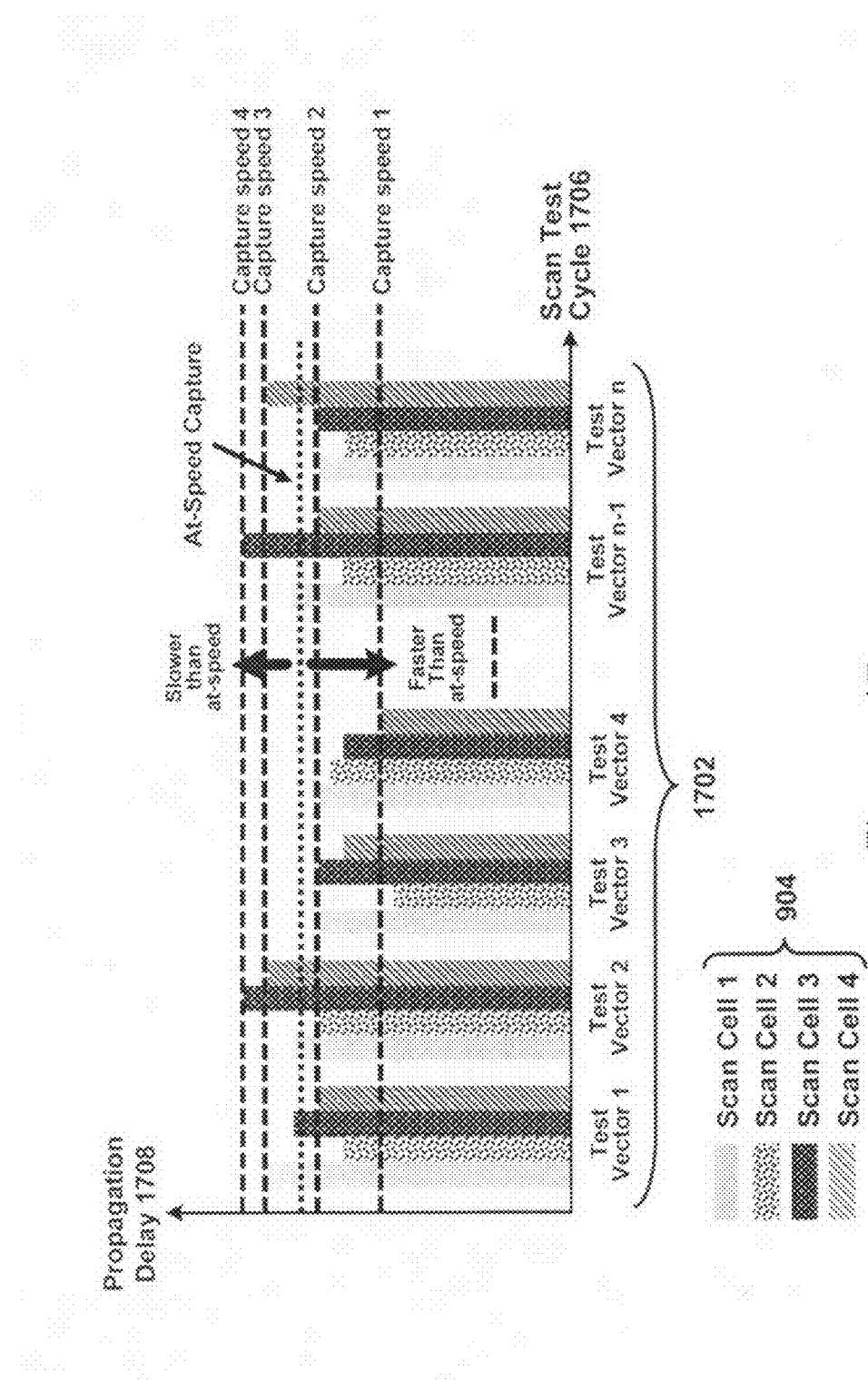
FIG. 17 illustrates the results of scan tests that after outliers and over-test and under-test conditions have been addressed according to an embodiment of the invention.

FIG. 17 depicts the aggregate result of the testing conducted according to the present invention. As shown, each cell is assured of proper operation during a test condition with an appropriate test vector in combination with an appropriate test clock frequency. One test was not sufficient to assure the integrity of the whole integrated circuit, but the implementation of various clock frequencies assured proper operation without creating undesirable over- and under-test conditions.

An implementing of slower than at speed capture as shown in FIG. 17 may be needed due to simultaneous switching which causes a phenomenon referred to as switching noise, di/dt (transient current swing), ground bounce, IR drop, or ground noise, power noise, etc. These disturbances cause switching circuitry to react to the signal slower than normal, causing signal to rise and fall slowly, exhibit high droop, shift their switching threshold voltage, and shift their receiver threshold voltage for example. The amount of simultaneous switching created by a launch pulse can cause different delays to the signal path. The present invention can accommodate for these situations.

As shown in FIG. 17, four different capture speeds may be implemented so as to properly test the various cells of the integrated circuit. When using a given capture speed to test a particular cell, it may be necessary to mask other cells. For example, when using capture speed 1, only certain cells for certain test vectors will be appropriately tested. Likewise for other capture speeds. One of skill in the art understands that test time optimization can be achieved by considering several variables depicted in the FIG. 17, such as scan cells, capture speeds, and test vectors.

We turn now to the manner in which the present invention can be implemented in an integrated circuit design flow to improve the resulting design as well as speed up the design process.

Figure 18:
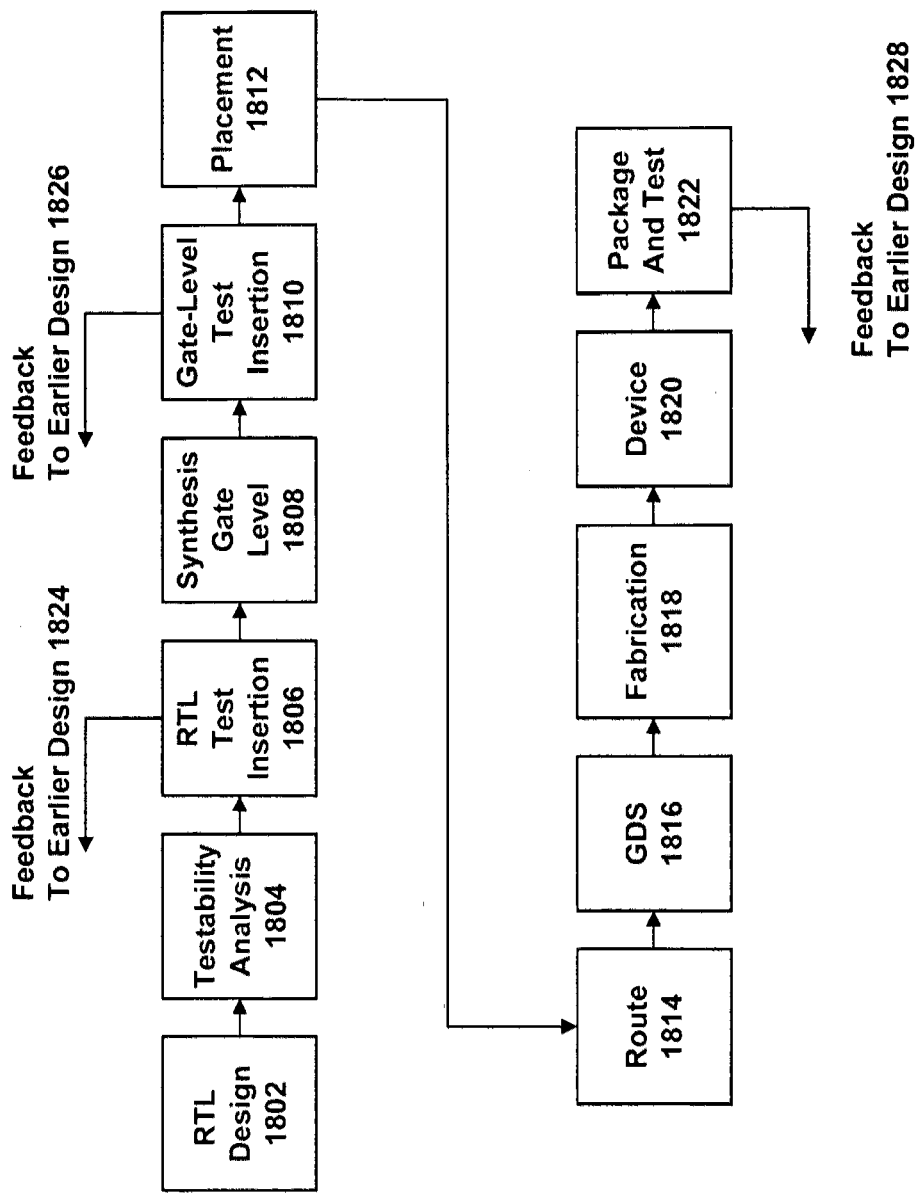
FIG. 18 illustrates an integrated circuit design flow that implements a variable test clock frequency according to an embodiment of the invention.

Shown in FIG. 18 is a flow 1800 for designing an integrated circuit according to the present invention that progresses from RTL design 1802, testability analysis 1804, RTL test insertion 1806, gate-level synthesis 1808, gate-level test insertion 1810, placement 1812, route 1814, GDS 1816, fabrication 1818, device 1820, and package and test 1822. In an embodiment of the invention that implements a variable test clock frequency within an integrated circuit, a design may be tested using simulation techniques at various stages including, for example, RTL test insertion 1806 and gate-level test insertion 1810. The results of such simulation can then be fed back to earlier stages of the design process to improve the design. For example, at RTL test insertion 1806, appropriate test vectors can be generated and simulated at various test clock frequencies using electronic design automation (EDA) tools available to a designer. The results from such simulation and testing can then be fed back (see 1828) to modify the design at earlier stages, for example, RTL design 1802. Also, for example, at gate-level test insertion 1810, appropriate test vectors can again be generated and simulated at various test clock frequencies using electronic design automation (EDA) tools available to a designer. The results from such simulation and testing can then be used to modify the design at earlier stages, for example, RTL design 1802 and gate-level synthesis 1808. In an embodiment of the invention that implements a variable test clock frequency within an integrated circuit, a design may also be tested at package and test 1822.

Appropriate test vectors can be generated using automatic test pattern generation (ATPG) tools that can then be implemented at various test clock frequencies using automatic test equipment (ATE) available to a designer. The results of such simulation can then be fed back (see 1828) to earlier stages of the design process to improve the design. For example, the RTL or gate level design (see 1802 and 1808) can be modified. Also, placement 1812 and route 1814 may be modified responsive to the results of scan testing at package and test 1822.

A design may be tested at the package and test stage and the results fed back to earlier design stages with an implementation that uses variable test clock frequency within an integrated circuit as well as an implementation with an external variable test clock frequency such as implemented with an FPGA.

Figure 19:
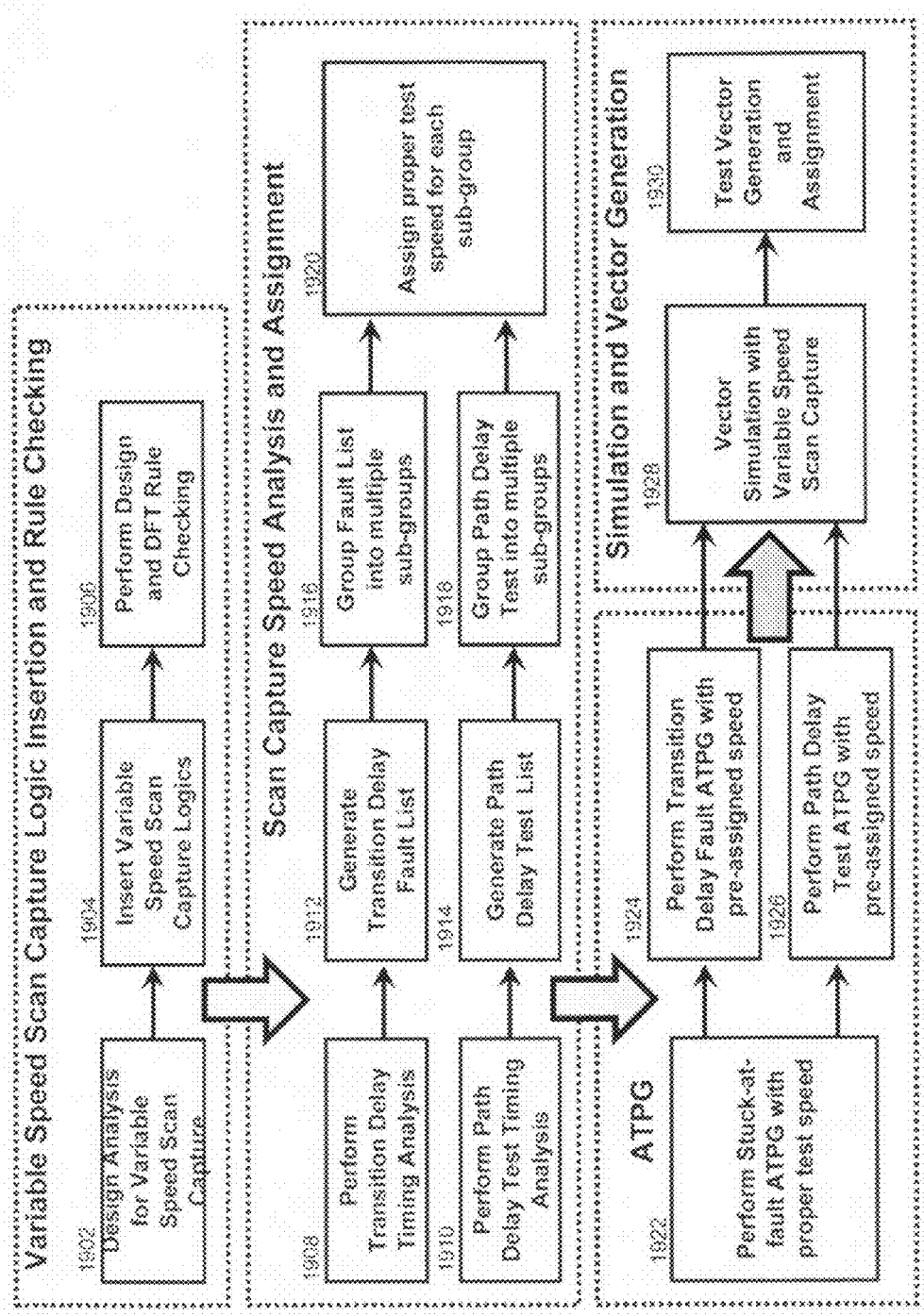
FIG. 19 illustrates a method for assigning timing information, including setting clock frequencies, according to an embodiment of the invention.

Variable speed scan capture (VSSC) techniques become more effective when design analysis, timing analysis, and DFT/ATPG tools are aware of the techniques so as to assign optimum at-speed test timing values. Shown in FIG. 19 is a method according to the present invention for assigning timing information, including setting clock frequencies.

As shown in step 1902 an integrated circuit is first analyzed for implementation of the techniques of the present invention. For example, different clock domains are analyzed to identify clocking relationships between different clock domains for optimum at-speed testability. Based on this analysis, logic associated with the implementation of variable speed scan capture according to the present invention can be inserted at step 1904. For example, a DFT insertion tool can implement the needed variable speed scan capture test clock generators within the design. Also, lists of timing requirements can be generated for implementation of variable speed scan capture. The same approach can be used for LBIST-based application according to the present invention. Subsequently, at step 1906, rule checking can be applied. For example, design and DFT rules may be confirmed to be within design specifications.

Next, transition delay timing analysis and path delay timing analysis can be performed at steps 1908 and 1910, respectively, using appropriate tools as known in the art. Next, transition delay fault lists and path delay test lists are generated at steps 1912 and 1914, respectively, also using appropriate tools as known in the art. Moreover, these types of tools are widely used in at-speed and transition delay test generation processes in the scan test and BIST environment. Once the lists are made, both transition delay fault list and delay test list go through a grouping process where fault lists having similar timing characteristics and the delay fault lists having similar delay characteristics are grouped together to use one set of VSSC speed (steps 1916 and 1918).

Here, variable speed scan capture granularity, design speed, and test requirements play roles to make up the groups where under- and over-test conditions are closely controlled with given variable speed scan capture capabilities. Then, at step 1920 proper test speeds for each sub-group are assigned.

For finer granularity in timing adjustment, finer timing resolutions may be required during test, and more groups may be necessary for finer timing control. In the prior art such fine grain timing resolution comes with much overhead in test volume and test time in addition to test generation and verification. But the present invention can add these capabilities with minimum overhead into the overall process.

At step 1920, inter-clock and intra-clock domain at-speed test frequency can be assigned as well. With appropriate at-speed information the techniques of the present invention can be readily applied.

Once desired grouping and test time assignment are done, the generated lists go to the ATPG process starting at step 1922 where appropriate transition delay test and path delay test patterns are generated with assigned VSSC speed for each group. More specifically, at step 1922 stuck-at fault ATPG is performed at appropriate test speeds. Here, it should be noted that that stuck-at test vectors are generated first in order to reduce overall test volumes. Next at step 1924, transition delay fault ATPG is performed at pre-assigned speeds. Also, at step 1926, path delay test ATPG is performed with pre-assigned speeds.

Simulation and vector generation can then be performed. At step 1928, vector simulation with variable speed scan capture is performed. Then, at step 1930, appropriate test vectors are generated and assigned.

After test patterns for transition delay test and path delay test, cross- or intra-clock domain test with assigned test speed can be verified for final signoff to the device tester. There may involve additional timing related verifications with pre- and/or post-layout information for additional DFT quality assurance, however, the present invention does not add restrictions or over heads to the flow.

During the diagnosis and debugging process with either first production sample devices or mass production parts, two concerns may arise: (1) an over-test condition due to over stress or (2) an under-test condition due to small delay related faults. Methods for performing diagnosing and debugging for over- and under-test conditions according to the present invention will be described with reference to FIGS. 20 and 21.

Figure 20:
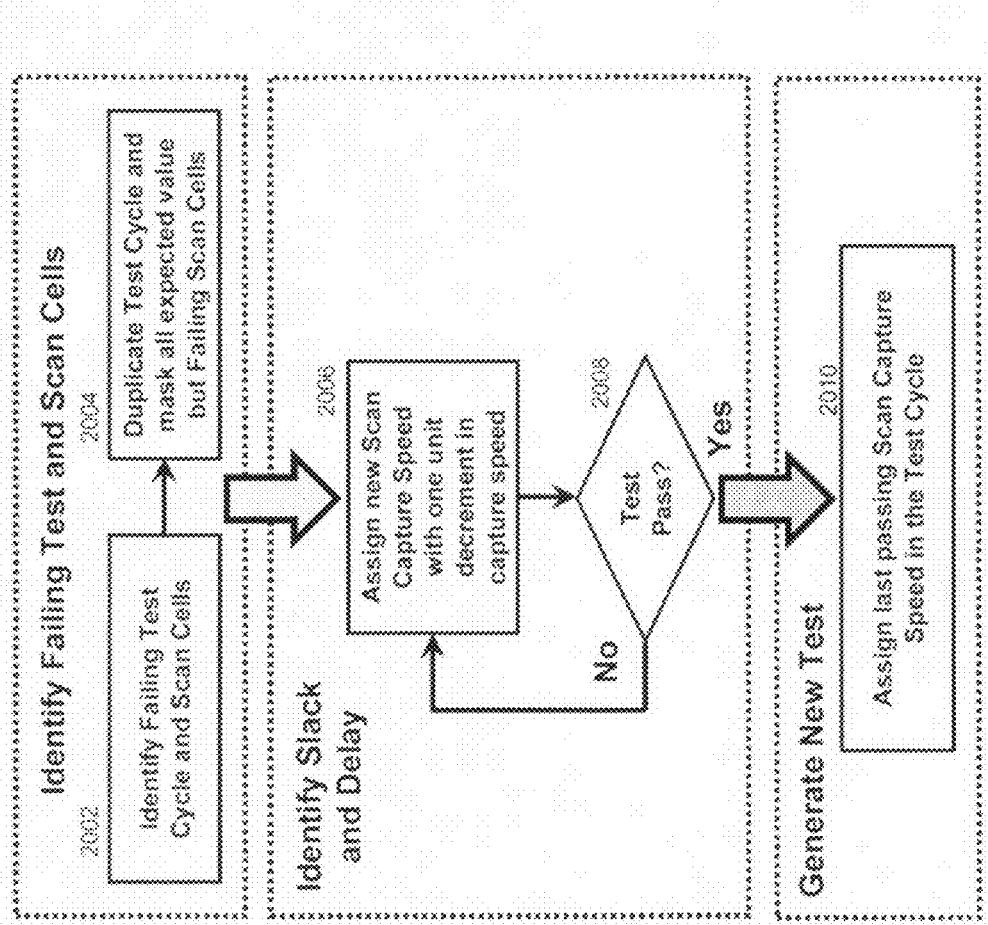
FIG. 20 illustrates a method for diagnosing and debugging over-test conditions according to an embodiment of the invention.

Shown in FIG. 20 is a method for diagnosing and debugging over-test conditions. First, failing tests and scan cells are identified. At step 2002, failing test cycles and scan cells are identified using, for example, a first test clock frequency. Then, at step 2004, failing test cycles are duplicated while masking all expected values except for those associated with the failing scan cells.

The method of the present invention then proceeds to identify slack and delay conditions. As shown at step 2006, new scan capture speeds are assigned. At step 2008, the associated scan cell is tested for a pass fail condition. Where the test fails, step 2008 is repeated so as to increment the speed down as necessary in one unit increment. Steps 2006 and 2008 are repeated until the test passes at step 2008. Using the obtained information, a new test is generated at step 2010 by assigning the last passing scan capture speed in the test cycle.

The method of FIG. 20 is exemplary and not intended to be limiting. Indeed those of skill in the art can implement other methods. For example, rather than using one step increments at step 2006, other numerical methods can be implemented so as to converge on the passing condition to be used at step 2010. Known techniques include, bisection and interpolation methods but others are also possible.

In situations where difference in timing between the original test frequency and the new test frequency is not significant to cause quality concerns for the failing test set after diagnosis, the original test conditions and test vectors may be implemented with the new test speed without duplicating the test set with new timing information. If the difference in slack is significant by a designer's assessment, it is better to duplicate the test as described for the method of FIG. 20.

During the process of diagnosing the device, depending on the cell masking and the amount of clock frequency change, Shmoo plot techniques can be applied on the device under test implementing the present invention. Using Shmoo plot techniques the response of the IC under test can be analyzed over varying test conditions. Shmoo techniques can be applied to any part of scan chain in the any of the test vector cycle to identify slack and delay margins. In an incremental manner, groups of scan cells can be also be Shmooed to determine the effect of the scan test speed within the same test set or within multiple test sets. In extreme situations, each scan cell can be Shmooed or programmed with different test clock frequencies.

Debugging under-test is slightly different because no test has failed such that it may not be known where under-test conditions may actually exist. For this reason, identification of under-test conditions is better performed during the DET analysis and insertion process. Also, field returns or production failures can provide information as to the existence of under-test conditions.

Figure 21:
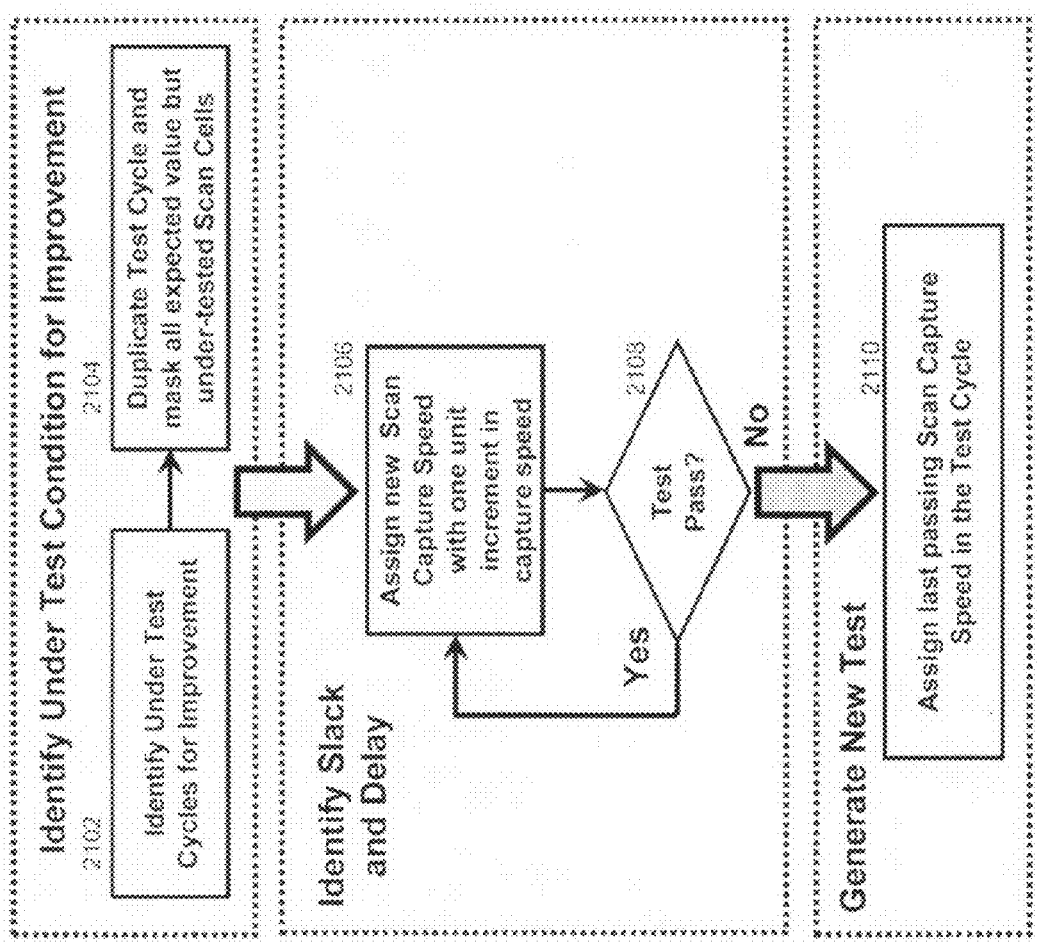
FIG. 21 illustrates a method for diagnosing and debugging under-test conditions according to an embodiment of the invention.

Shown in FIG. 21 is a method for diagnosis and debugging under-test conditions. First, under-test conditions are identified at step 2102. Then, at step 2104, under-test conditions are duplicated while masking all expected values except for those associated with the scan cells of the under-test conditions.

The method of the present invention then proceeds to identify slack and delay conditions. For example, Shmoo plot techniques can be implemented for cells selected for the given test cycle. Using such techniques, the method of the present invention reveals the under test conditions. As shown at step 2106, new scan capture speeds are assigned. At step 2108, the associated scan cell is tested for a pass fail condition. Where the test passes, step 2108 is repeated so as to increment the speed up as necessary in one unit increments. Steps 2106 and 2108 are repeated until the test fails at step 2108. Using the obtained information, a new test is generated at step 2110 by assigning the last passing scan capture speed in the test cycle.

The method of FIG. 21 is exemplary and not intended to be limiting. Indeed those of skill in the art can implement other methods. For example, rather than using one step increments at step 2006, other numerical methods can be implemented so as to converge on the passing condition to be used at step 2010. Known techniques include, bisection and interpolation methods but others are also possible.

It is important to note that the granularity and accuracy of the test clock used in the present invention plays a key role in effectiveness of the variable at-speed tests. Indeed, the requirements for the test clock generator may vary significantly between the different devices. Also, the test clock generator must be able to accommodate different design requirements even within the same technology family. Likewise, test clock generator requirements may vary between successive generations of technology nodes.

Accordingly, care should be taken when choosing an appropriate test clock generator. There are many techniques known to those of ordinary skill in the art for generating test clock frequencies.

One of skill in the art can, therefore, adopt the processes of FIGS. 20 and 21, including with modifications, to accommodate timing requirements of the present invention into existing test suites without sacrificing current test coverage.

Figure 22:
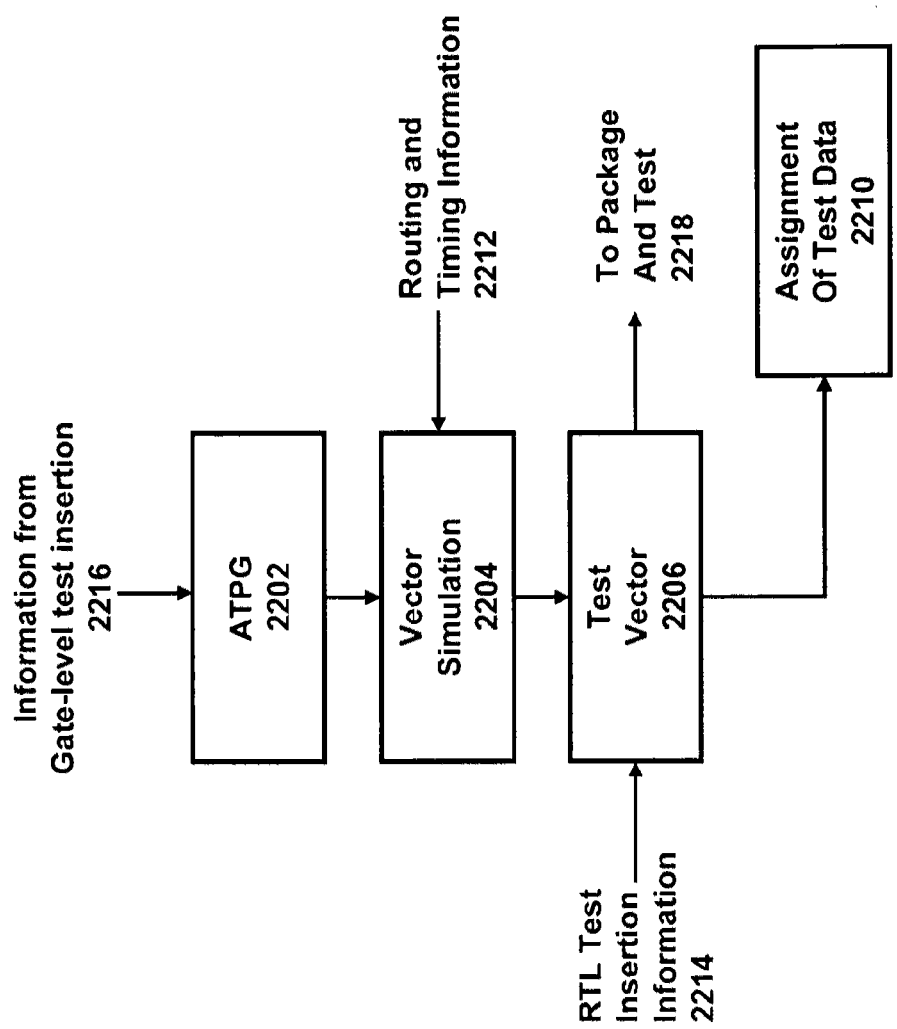
FIG. 22 illustrates a process for generating test vectors that implements a variable test clock frequency according to an embodiment of the invention.

Shown in FIG. 22 is a process for developing test vectors for use in scan testing using a variable test clock frequency where the variable test clock generator is included within the integrated circuit. As shown, information from a gate-level test insertion step 2216 is input to an ATPG tool. Two prominent vendors of ATPG tools include Synopsys and Mentor Graphics. The use of these tools along with information about the circuits being tested and with the flexibility to adjust the frequency of a test clock results in a well-tested integrated circuit that reduces both over- and under-test conditions to provide a maximum yield while assuring the operation of the integrated circuit. As further shown in FIG. 22, the vectors generated by the ATPG tool at step 2202 are then simulated to assure proper coverage at step 2204. Routing and timing information 2212 are made available at step 2204 to more properly simulate the vectors. Thereafter, appropriate test vectors are generated at step 2206 using among other things RTL Test Insertion information 2214. The resulting test vectors that take into account a, variable test clock frequency and that seek to provide maximal coverage are then passed on to the Package and Test step 2218 so that the vectors may be utilized in scan test for packaged integrated circuits. Also, the test vector information can also be used at step 2210 so as to assign appropriate test data to the associated test vectors for the tester.

Figure 23:
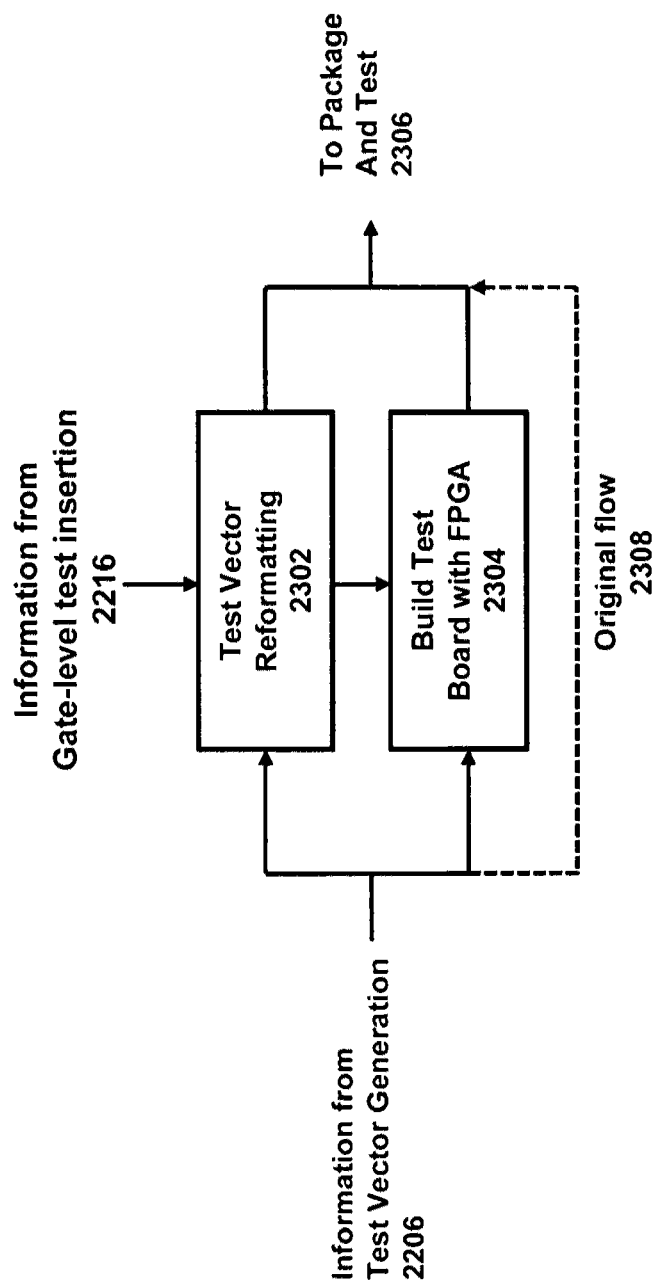
FIG. 23 illustrates a process for generating test vectors that implement a variable test clock frequency according to an embodiment of the invention.

Shown in FIG. 23 is a process for developing test vectors for use in scan testing using a variable test clock frequency where the variable test clock circuitry is provided externally to the integrated circuit. Information from test vector generation step 2206 and from gate-level test insertion step 2216 is passed to test vector reformatting step 2302. At step 2302, a test vector may be formatted to account for the clock vector that will be appended to a test vector. Also, a test vector may be reformatted to account for timing issues associated with external circuitry that implements the variable test clock frequency. For example, the test vector may need to be appended with an extra cycle to account for delays through the external circuitry. Appropriate test circuitry is built at step 2304 that accounts for the reformatted test vectors as well as information from the test vector generation step 2206. In an embodiment of the invention, a test board that implements an FPGA is used to generate the variable test clock frequency. Other embodiments of the test board may implement other devices including PLDs, CPLDs, or ASICs as may be chosen by one of ordinary skill in the art.

The present invention provides flexibility by allowing for the implementation of FIG. 23 to be bypassed completely if necessary as shown for branch 2308. For example, for troubleshooting purposes, one of skill in the art may desire to revert back to the legacy condition that does not implement a variable test clock frequency.

It should be appreciated by those skilled in the art that the specific embodiments disclosed above may be readily utilized as a basis for modifying or designing other scan techniques for carrying out the same purposes of the present invention. It should also be appreciated by those skilled in the art that such modifications do not depart from the scope of the invention as set forth in the appended claims.

What is claimed is:

1. A method for performing a scan test comprising:
shifting a test vector that is at least n+m bits long into a clock control register that is m bits long, wherein n bits corresponds to scan test stimulus information and m bits correspond to clock information and wherein m bits of clock information are stored in the clock control register;
shifting n bits of the test vector into a register of scan chain in an integrated circuit;
generating a test clock signal at a predetermined frequency responsive to the m bits of clock information;
generating a launch signal responsive to the test clock signal; and
generating a capture signal responsive to the test clock signal, wherein the capture signal initiates operation to capture a response pattern of the integrated circuit.

2. The method of claim 1, wherein the test vector is n+m+p bits long, wherein the time required to shift p bits corresponds to a delay for synchronizing the clock control register with the register.

3. The method of claim 1, further comprising loading a test instruction into an instruction register, wherein the instruction initiates the generation of the launch and capture signals.

4. The method of claim 1, further comprising shifting out of the register of scan chain the captured response pattern of the integrated circuit.

5. The method of claim 4, further comprising shifting out of the clock control register the clock information.

6. The method of claim 5, further comprising shifting n bits of a second test vector into a register of the scan chain in the integrated circuit while shifting out the captured response pattern.

7. The method of claim 6, further comprising shifting m bits of the test vector into the clock control register while shifting out the captured response pattern.

8. The method of claim 1, wherein the time between the launch and capture signals is responsive to the predetermined frequency of the test clock signal.

9. The method of claim 4, wherein the captured response pattern of the integrated circuit is compared to an expected response pattern.

10. The method of claim 1, wherein the predetermined frequency is chosen from among $2^m$ frequencies.

* * * * *